(12) United States Patent
Lee et al.

(10) Patent No.: US 11,927,879 B2
(45) Date of Patent: Mar. 12, 2024

(54) EXTREME ULTRAVIOLET (EUV) PHOTOMASK AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Moosong Lee, Seoul (KR); Seung Yoon Lee, Seoul (KR); Jeongjin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 144 days.

(21) Appl. No.: 17/407,642

(22) Filed: Aug. 20, 2021

(65) Prior Publication Data
US 2022/0100077 A1   Mar. 31, 2022

(30) Foreign Application Priority Data

Sep. 29, 2020 (KR) .................. 10-2020-0126748

(51) Int. Cl.
| | | |
|---|---|---|
| *G03F 1/22* | (2012.01) | |
| *G03F 1/24* | (2012.01) | |
| *G03F 1/42* | (2012.01) | |
| *G03F 7/20* | (2006.01) | |
| *G03F 9/00* | (2006.01) | |

(52) U.S. Cl.
CPC ................. *G03F 1/22* (2013.01); *G03F 1/24* (2013.01); *G03F 1/42* (2013.01); *G03F 7/2004* (2013.01); *G03F 7/2022* (2013.01); *G03F 9/7003* (2013.01); *G03F 9/7084* (2013.01)

(58) Field of Classification Search
CPC ..... G03F 1/22; G03F 1/24; G03F 1/42; G03F 7/2004; G03F 7/2022; G03F 9/7003; G03F 9/7084
USPC ................................. 430/5, 22, 30
See application file for complete search history.

(56) References Cited

U.S. PATENT DOCUMENTS

| | | |
|---|---|---|
| 5,250,983 A | 10/1993 | Yamamura |
| 6,331,885 B1 | 12/2001 | Nishi |
| 8,728,713 B2 | 5/2014 | Fabinski et al. |
| 8,786,054 B2 | 7/2014 | Harn et al. |
| 8,908,152 B2 | 12/2014 | Bijnen et al. |
| 9,087,740 B2 | 7/2015 | Ausschnitt et al. |
| 10,054,863 B2 | 8/2018 | De Boer et al. |
| 10,620,530 B2 | 4/2020 | Yu et al. |
| 2004/0009431 A1 | 1/2004 | Amo et al. |
| 2009/0225331 A1 | 9/2009 | Van Haren |
| 2011/0285975 A1 | 11/2011 | Tawarayama |
| 2016/0161837 A1 | 6/2016 | Hamamoto et al. |
| 2018/0143527 A1 | 5/2018 | Seo et al. |
| 2020/0073225 A1 | 3/2020 | Shih et al. |
| 2020/0166853 A1 | 5/2020 | Eugeni |

FOREIGN PATENT DOCUMENTS

KR   10-2010-0079307 A   7/2010

OTHER PUBLICATIONS

Communication dated Dec. 21, 2022 issued by the German Patent and Trademark Office in counterpart German Patent Application No. 102021124864.7.

*Primary Examiner* — Christopher G Young
(74) *Attorney, Agent, or Firm* — Sughrue Mion, PLLC

(57) ABSTRACT

A method includes forming a first photomask including N mask chip regions and a first mask scribe lane region surrounding each of the N mask chip regions, forming a second photomask including M mask chip regions and a second mask scribe lane region surrounding each of the M mask chip regions, performing a first semiconductor process including a first photolithography process using the first photomask on a semiconductor wafer; and performing a second semiconductor process including a second photolithography process using the second photomask on the semiconductor wafer. The first photolithography process is an extreme ultraviolet (EUV) photolithography process, the first photomask is an EUV photomask, N is a natural number of 2 or more, and M is two times N.

19 Claims, 21 Drawing Sheets

EXTREME ULTRAVIOLET (EUV) PHOTOMASK AND METHOD OF MANUFACTURING SEMICONDUCTOR DEVICE USING THE SAME

CROSS-REFERENCE TO RELATED APPLICATION(S)

This application claims priority to Korean Patent Application No. 10-2020-0126748 filed on Sep. 29, 2020 in the Korean Intellectual Property Office, the disclosure of which is incorporated by reference herein in its entirety.

BACKGROUND

1. Field

The present disclosure relates to an extreme ultraviolet (EUV) photomask, an extreme ultraviolet photolithography process equipment, an extreme ultraviolet photolithography process, a method of manufacturing a semiconductor device using the same, and a semiconductor device and a semiconductor system, prepared using the same.

2. Description of Related Art

As a semiconductor device becomes highly integrated and reduced in size, a technology for forming circuit patterns of the semiconductor device in a relatively small area is required. In order to meet these technical requirements, a wavelength of a light source used in a photolithography process may be shorter. For example, a wavelength of a light source used in the photolithography process may be shorter when g-line light (436 nm), i-line light (365 nm), a KrF laser beam (248 nm), and/or an ArF laser beam (193 nm) are used.

Recently, an extreme ultraviolet (EUV) photolithography process using an extreme ultraviolet (EUV) light has been proposed. Since such an EUV light may be absorbed by most refractive optical materials, EUV photolithography processes generally use a reflective optical system rather than a refractive optical system, and an EUV photomask.

SUMMARY

It is an aspect to provide a method of manufacturing a semiconductor device, using an extreme ultraviolet photomask.

According to an aspect of one or more embodiments, there is provided a method comprising forming a first photomask including N mask chip regions and a first mask scribe lane region surrounding each of the N mask chip regions; forming a second photomask including M mask chip regions and a second mask scribe lane region surrounding each of the M mask chip regions; performing a first semiconductor process including a first photolithography process using the first photomask on a semiconductor wafer; and performing a second semiconductor process including a second photolithography process using the second photomask on the semiconductor wafer, wherein the first photolithography process is an extreme ultraviolet (EUV) photolithography process, the first photomask is an EUV photomask, N is a natural number of 2 or more, and M=2*N.

According to another aspect of one or more embodiments, there is provided a method comprising loading a semiconductor wafer into a wafer stage of an extreme ultraviolet (EUV) photolithography equipment equipped with an extreme ultraviolet (EUV) photomask; in the EUV photolithography equipment, sequentially performing a shot process a plurality of times, the shot process including aligning the semiconductor wafer and irradiating light from an extreme ultraviolet (EUV) light source to the semiconductor wafer; and unloading the semiconductor wafer from the EUV photolithography equipment, wherein the semiconductor wafer has a plurality of shot regions, each shot region of the plurality of shot regions has an upper shot region formed by one shot process of the shot process performed the plurality of times, and a lower shot region formed by another shot process of the shot process performed the plurality of times, a central area of each shot region comprises a wafer alignment mark region, and the wafer alignment mark region comprises alignment patterns of a first wafer alignment mark formed by the one shot process and alignment patterns of a second wafer alignment mark formed by the another shot process.

According to yet another aspect of one or more embodiments, there is provided an extreme ultraviolet (EUV) photomask comprising a mask substrate having a first surface, and a second surface opposing the first surface; a plurality of extreme ultraviolet (EUV) mask chip regions disposed on the first surface of the mask substrate; and an extreme ultraviolet (EUV) mask scribe lane region disposed on the first surface of the mask substrate and surrounding the plurality of EUV mask chip regions, wherein the EUV mask scribe lane region has a first side, and a second side opposing the first side, and wherein the EUV mask scribe lane region comprises a first mask alignment layout pattern adjacent to a central area on the first side and a second mask alignment layout pattern adjacent to a central area on the second side.

According to yet another aspect of the one or more embodiments, there is provided a method of manufacturing a semiconductor device. The method includes forming an extreme ultraviolet (EUV) photomask and exposing a semiconductor wafer using the EUV photomask. The EUV photomask includes a mask layout region and a border region surrounding the mask layout region. In the EUV photomask, the mask layout region includes a plurality of mask chip regions and a mask scribe lane region surrounding the plurality of mask chip regions, wherein the mask scribe lane region includes a first mask alignment layout pattern in a first mask alignment mark region and a second mask alignment layout pattern in a second mask alignment mark region, and the first mask alignment mark region is adjacent to a central area on a first side of the mask layout region, and the second mask alignment mark region is adjacent to a central area on a second side of the mask layout region, opposing the first side.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings.

Figure 1:
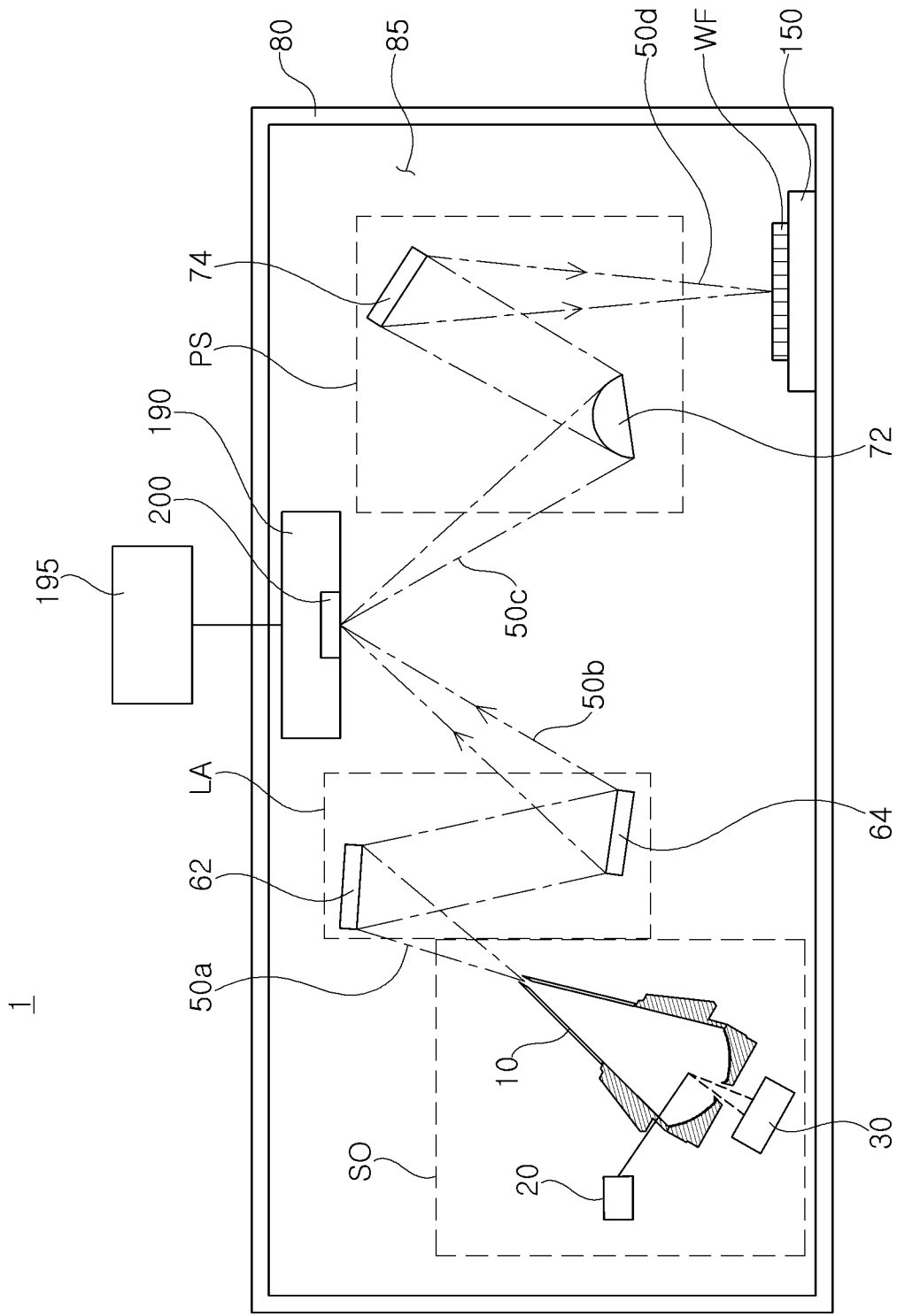
FIG. 1 is a view schematically illustrating an extreme ultraviolet (EUV) photolithography process equipment according to an embodiment.

With reference to FIG. 1, an extreme ultraviolet (EUV) photolithography process equipment according to an embodiment will be described. FIG. 1 is a view schematically illustrating an extreme ultraviolet (EUV) photolithography process equipment according to an embodiment.

Referring to FIG. 1, an extreme ultraviolet (EUV) photolithography process equipment 1 may include an exposure chamber 80, an extreme ultraviolet light source system SO, a lithographic apparatus LA, a projection system PS, a mask stage 190 on which a photomask 200 is mounted, and a wafer stage 150 on which a semiconductor wafer WF is mounted.

The wafer stage 150 may move the semiconductor wafer WF to change an exposed area of the semiconductor wafer WF.

The exposure chamber 80 may have an internal space 85, and the extreme ultraviolet light source system SO, the lithographic apparatus LA, the projection system PS, the mask stage 190, and the wafer stage 150 may be arranged in the internal space 85. In some embodiments, some components of the extreme ultraviolet light source system SO, the lithographic apparatus LA, the projection system PS, the mask stage 190, and the wafer stage 150 may be disposed outside the exposure chamber 80. For example, in some embodiments, a portion of the light source system SO may be disposed outside the exposure chamber 80.

In the mask stage 190, the photomask 200 may be fixed to the mask stage 190 by an electrostatic force formed by power applied from a power supply 195. The semiconductor wafer WF may be loaded onto and/or unloaded from the wafer stage 150.

In order to prevent first light 50a of extreme ultraviolet light generated by the extreme ultraviolet light source system SO from being absorbed by a gas, the internal space 85 of the exposure chamber 80 may be provided to have a low pressure state of 5 Pa or less or may be provided to have a vacuum state.

In some embodiments, the extreme ultraviolet (EUV) light may have a wavelength of about 4 nm to about 124 nm.

In other embodiments, the extreme ultraviolet (EUV) light may have a wavelength of about 4 nm to about 20 nm.

In still other embodiments, the extreme ultraviolet (EUV) light may have a wavelength of about 13.5 nm.

The extreme ultraviolet light source system SO may include a light source chamber 10, an extreme ultraviolet light source 30 as a driver light source, and a droplet supply 20. The extreme ultraviolet light source system SO may generate extreme ultraviolet light with a wavelength of less than approximately 100 nm. The extreme ultraviolet light source 30 may be, for example, a plasma light source. In addition, the plasma light source may use a $CO_2$ laser as an excitation light source, and may be a laser-produced plasma (LPP) light source targeting a droplet made of any one of tin (Sn), lithium (Li), and xenon (Xe). The extreme ultraviolet light source system SO according to an embodiment may use a master oscillator power amplifier (MOPA) method. For example, a seed laser may be used to generate a pre-pulse and a main pulse, the pre-pulse may be irradiated to a droplet, the main pulse may be re-irradiated to the droplet to generate a plasma, and the plasma may be used to emit an extreme ultraviolet light.

In an interior of the light source chamber 10 of the extreme ultraviolet light source system SO, a laser beam supplied by the extreme ultraviolet light source 30 and a droplet supplied by the droplet supply 20 may collide more than 50000 times per second, to generate a plasma. A collector of the light source chamber 10 may collect extreme ultraviolet (EUV) light radiated from the plasma in all directions, may concentrate the collected EUV light in a forward direction, and may provide the concentrated EUV light to the lithographic apparatus LA.

The lithographic apparatus LA may include a plurality of mirrors, to pass first light 50a of the extreme ultraviolet light, emitted from the extreme ultraviolet light source system SO, through the lithographic apparatus LA, and irradiate second light 50b, passed through the lithographic apparatus LA, onto a surface of the photomask 200 of the mask stage 190. FIG. 1 illustrates only two mirrors 62 and 64 for simplicity of the drawings and convenience of description. That is, while the example of FIG. 1 illustrates two mirrors 62 and 64, embodiments are not limited thereto and, in some embodiments, more than two mirrors may be provided.

The projection system PS may include a plurality of mirrors, to pass third light 50c of the extreme ultraviolet light, reflected from the photomask 200, and irradiate fourth light 50d, passed through the projection system PS, onto a surface of the semiconductor wafer WF on the wafer stage 150, to expose a photoresist layer on the surface of the semiconductor wafer WF. FIG. 1 illustrates only two mirrors 72 and 74 for simplicity of the drawings and convenience of description. That is, while the example of FIG. 1 illustrates two mirrors 72 and 74, embodiments are not limited thereto and, in some embodiments, more than two mirrors may be provided.

A method of manufacturing a semiconductor device according to an embodiment will be illustrated with reference to FIGS. 2A, 2B, and 2C.

Figure 2A:
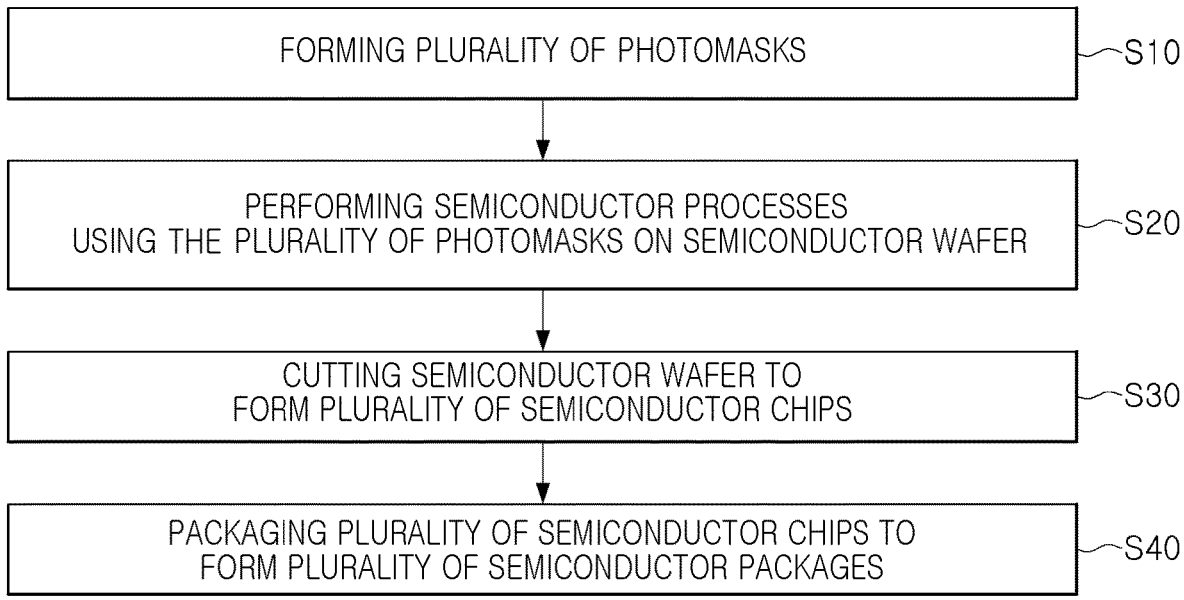
FIGS. 2A-2C are process flow diagrams schematically illustrating a method of manufacturing a semiconductor device according to various embodiments.
Figure 2B:
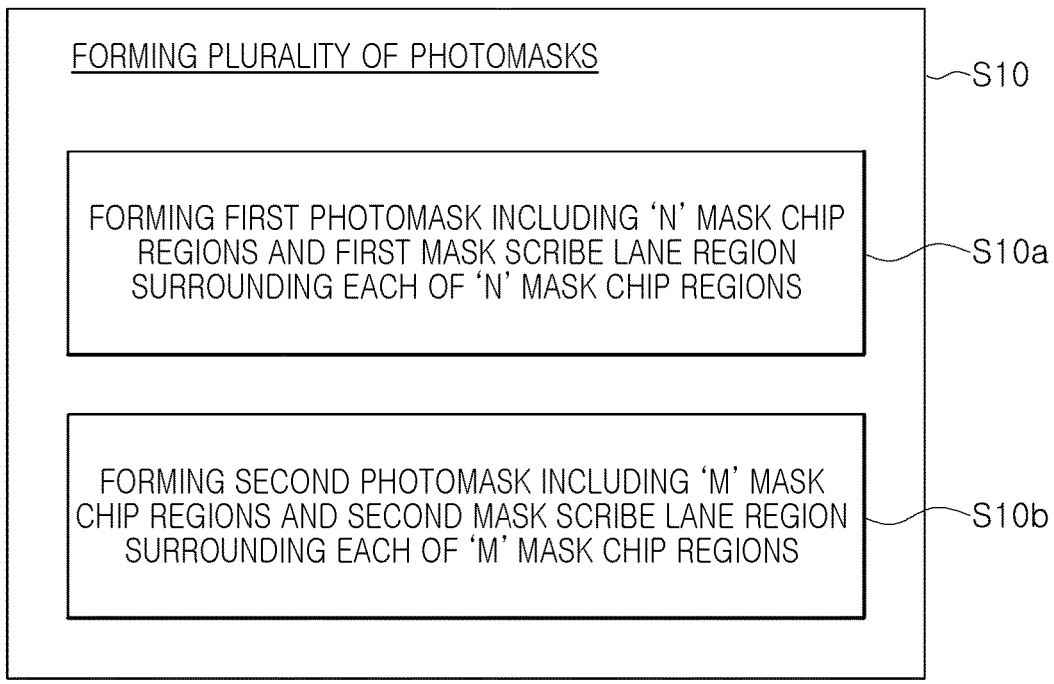
Figure 2C:
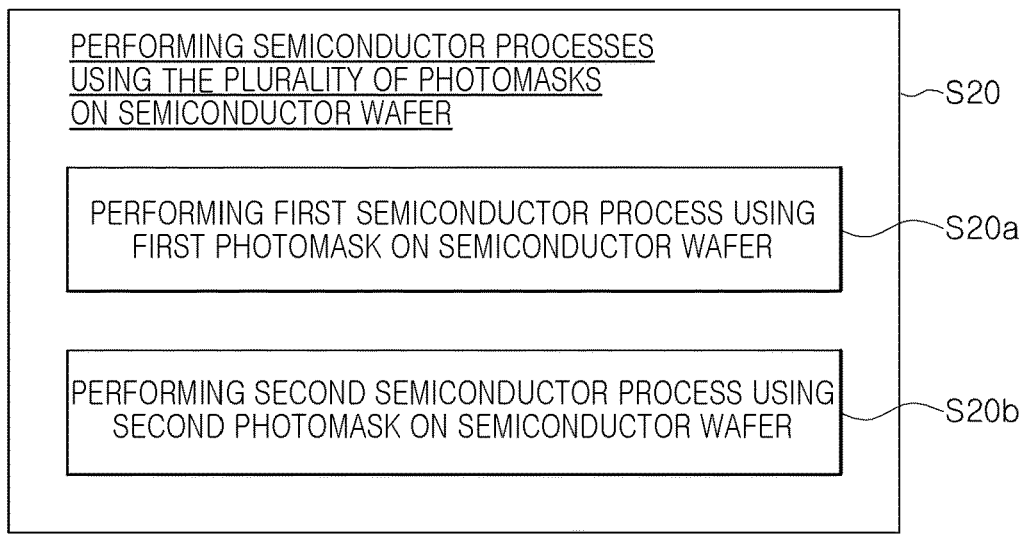

FIGS. 2A-2C are process flow diagrams schematically illustrating a method of manufacturing a semiconductor device according to various embodiments. FIG. 2A is a process flow diagram schematically illustrating a method of manufacturing a semiconductor device according to an embodiment, and FIG. 2B is a view schematically illustrating operation S10 of the method of FIG. 2A, and FIG. 2C is a view schematically illustrating operation S20 of the method of FIG. 2A in more detail.

Referring to FIGS. 2A, 2B, and 2C, a plurality of photomasks may be formed (S10). For example, a first photomask including 'N' mask chip regions and a first mask scribe lane region surrounding each of the 'N' mask chip regions may be formed (S10a). A second photomask including 'M' mask chip regions and a second mask scribe lane region surrounding each of the 'M' mask chip regions may be formed (S10b). Therefore, formation of the plurality of photomasks may include forming the first photomask and the second photomask.

In some embodiments, 'N' may be a natural number of 2 or more, and 'M' may be twice 'N.' That is, 'M' may be two times 'N', i.e., M=2*N. For example, in some embodiments, 'N' may be 2, and 'M' may be 4.

In embodiments, the "mask chip region" of the photomask may denote a region in which a circuit layout pattern is located. The "mask scribe lane region" of the photomask may denote a region in which a test layout pattern and an alignment layout pattern are located.

In embodiments, the term "mask chip region" may be defined as a region for transferring a circuit layout pattern of a photomask to a chip region of a semiconductor wafer.

In embodiments, the term "mask scribe lane region" may be defined as a region for transferring a layout pattern of a test element pattern and a layout pattern of an alignment mark in a photomask to a scribe lane region of a semiconductor wafer.

Among the plurality of photomasks, one or more of the photomasks may be an extreme ultraviolet (EUV) photomask, reflecting light, and another of the one or more of photomasks may be an EUV photomask or a transmissive photomask, transmitting light. The EUV photomask may be used in an EUV photolithography process using extreme ultraviolet light from a light source, and the transmissive photomask may be used in a photolithography process using g-line light having a wavelength of about 436 nm, i-line light having a wavelength of about 365 nm, a KrF laser beam having a wavelength of about 248 nm and/or an ArF excimer laser beam having a wavelength of about 193 nm, from a light source.

In some embodiments, the first photomask may be an EUV photomask, and the second photomask may be an EUV photomask.

In other embodiments, the first photomask may be an EUV photomask, and the second photomask may be a transmissive photomask.

Semiconductor processes using the plurality of photomasks may be performed on a semiconductor wafer (S20). For example, a first semiconductor process using a first photomask may be performed on the semiconductor wafer (S20a). A second semiconductor process using a second photomask may be performed on the semiconductor wafer (S20b). The second semiconductor process may be performed, after the first semiconductor process is performed. In some embodiments, the first semiconductor process may be a same process as the second semiconductor process. In other embodiments, the first semiconductor process may be a different process from the second semiconductor process.

The semiconductor wafer may be cut to form a plurality of semiconductor chips (S30). The cutting of the semiconductor wafer may include cutting along a scribe lane region of the semiconductor wafer to separate chip regions of the semiconductor wafer. The plurality of semiconductor chips may be packaged to form a plurality of semiconductor packages (S40). Each of the plurality of semiconductor packages may be used as an electronic component (e.g., 1002, 1003, or 1004 of FIG. 15) in various systems (e.g., 1000 of FIG. 15). Such a system will be described later with reference to FIG. 15.

The semiconductor processes (S20) using the plurality of photomasks may include performing a photolithography process. Hereinafter, a photolithography process for manufacturing a semiconductor device according to an embodiment will be illustrated with reference to FIGS. 3, and 4A to 4C.

Figure 3:
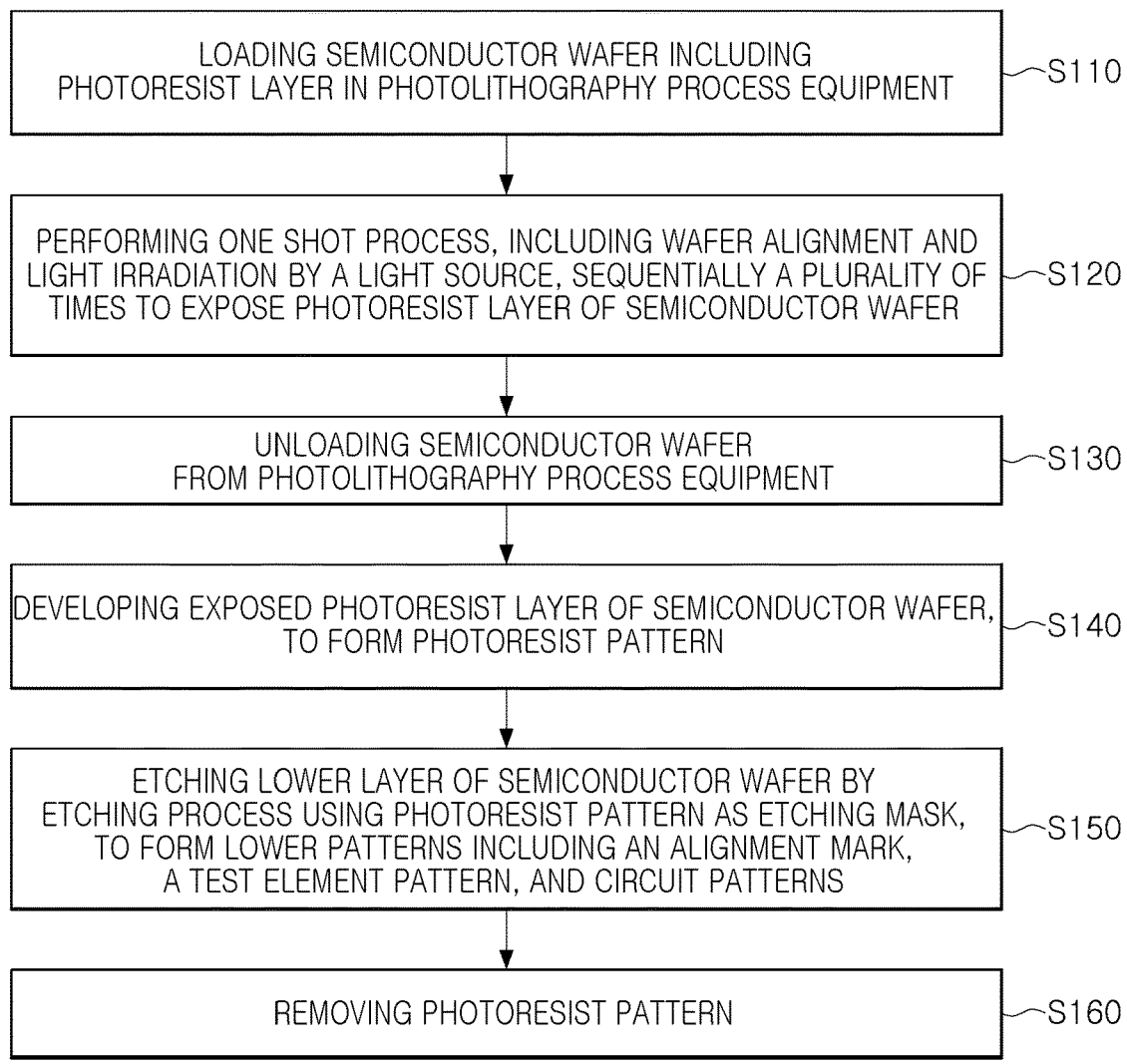
FIG. 3 is a process flow diagram schematically illustrating a photolithography process for manufacturing a semiconductor device according to an embodiment.
Figure 4A:
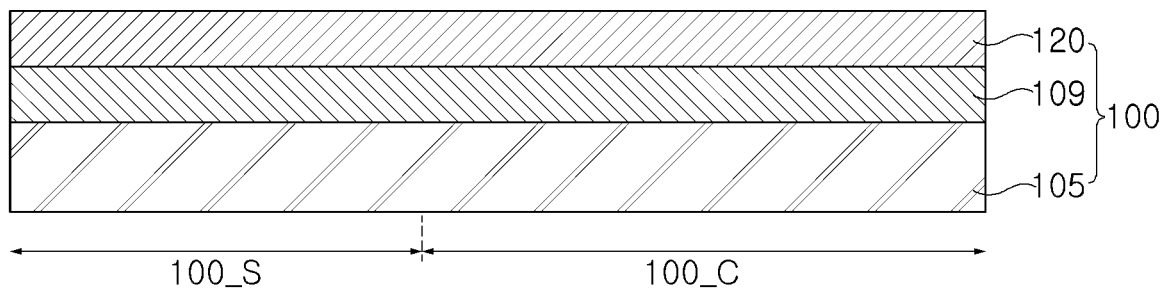
FIGS. 4A to 4C are cross-sectional views schematically illustrating a method of manufacturing a semiconductor device according to an embodiment.
Figure 4B:
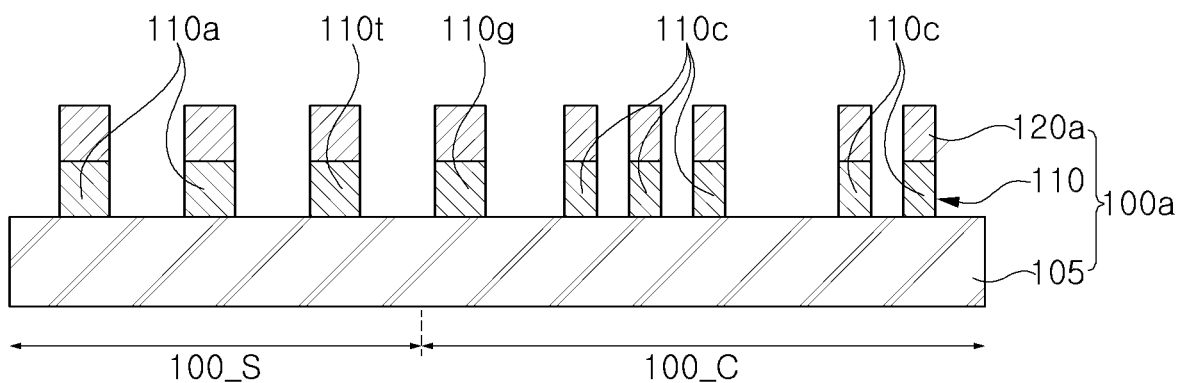
Figure 4C:
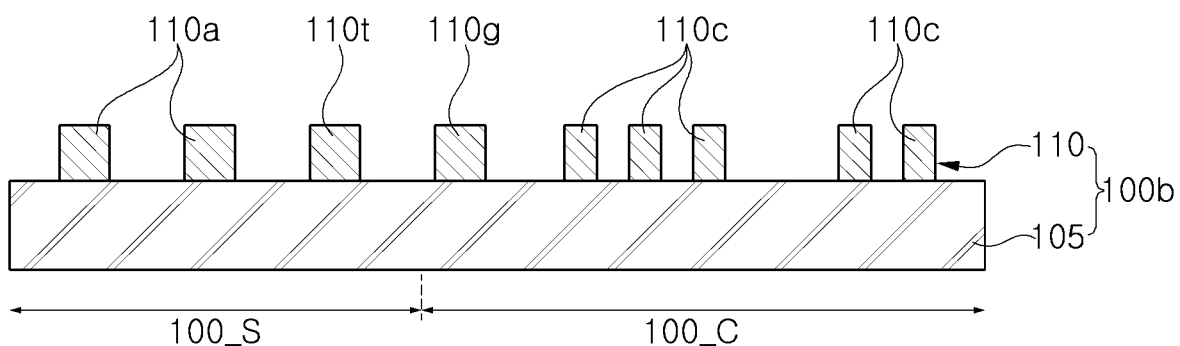

FIG. 3 is a process flow diagram schematically illustrating a photolithography process for manufacturing a semiconductor device according to an embodiment, and FIGS. 4A to 4C are cross-sectional views schematically illustrating a method of manufacturing a semiconductor device according to an embodiment.

Referring to FIGS. 3, 4A, 4B, and 4C, a semiconductor wafer 100 including a photoresist layer 120 may be loaded in a photolithography process equipment (S110). The photoresist layer 120 may be formed on a surface of the semiconductor wafer 100 by spin-coating. The semiconductor wafer 100 may include a semiconductor substrate 105, a lower layer 109 on the semiconductor substrate 105, and the photoresist layer 120 coated on the lower layer 109.

In some embodiments, when the photolithography process equipment is the EUV photolithography process equipment 1, as illustrated in FIG. 1, a thickness of the photoresist layer may be of about 200 nm to about 600 nm. However, the thickness of the photoresist layer is not limited to a thickness of about 200 nm to about 600 nm, and in some embodiments, the thickness of the photoresist layer may be less than about 200 nm or greater than about 600 nm.

A one shot process, including wafer alignment and light irradiation by a light source, may be performed sequentially a plurality of times to expose the photoresist layer 120 of the semiconductor wafer 100 (S120). The semiconductor wafer 100 may be unloaded from the photolithography process equipment (S130). The photoresist layer 120 of the semiconductor wafer 100 that is exposed may be developed to form a photoresist pattern 120a (S140).

An etching process using the photoresist pattern 120a as an etching mask may be performed. The lower layer 109 of the semiconductor wafer 100 may be etched by the etching process using the photoresist pattern 120a as an etching mask, to form lower patterns 110 including an alignment mark 110a, a test element pattern 110t, a guard ring pattern 110g, and circuit patterns 110c (S150). For example, the alignment mark 110a and the test element pattern 110t may be formed in a scribe lane region 100_S of the semiconductor wafer 100 and the guard ring pattern 110g and the circuit patterns 110c may be formed in a chip region 100_C of the semiconductor wafer 100.

In some embodiments, the guard ring pattern 110g may be omitted. In other words, in some embodiments, the lower patterns 110 may omit the guard ring pattern 110g. A semiconductor wafer 100a including the photoresist pattern 120a and the lower patterns 110 may be formed.

Subsequently, the photoresist pattern 120a may be removed. Therefore, after the photoresist pattern 120a is removed, and a semiconductor wafer 100b including the lower patterns 110 may be formed as illustrated in FIG. 4C.

Figure 5:
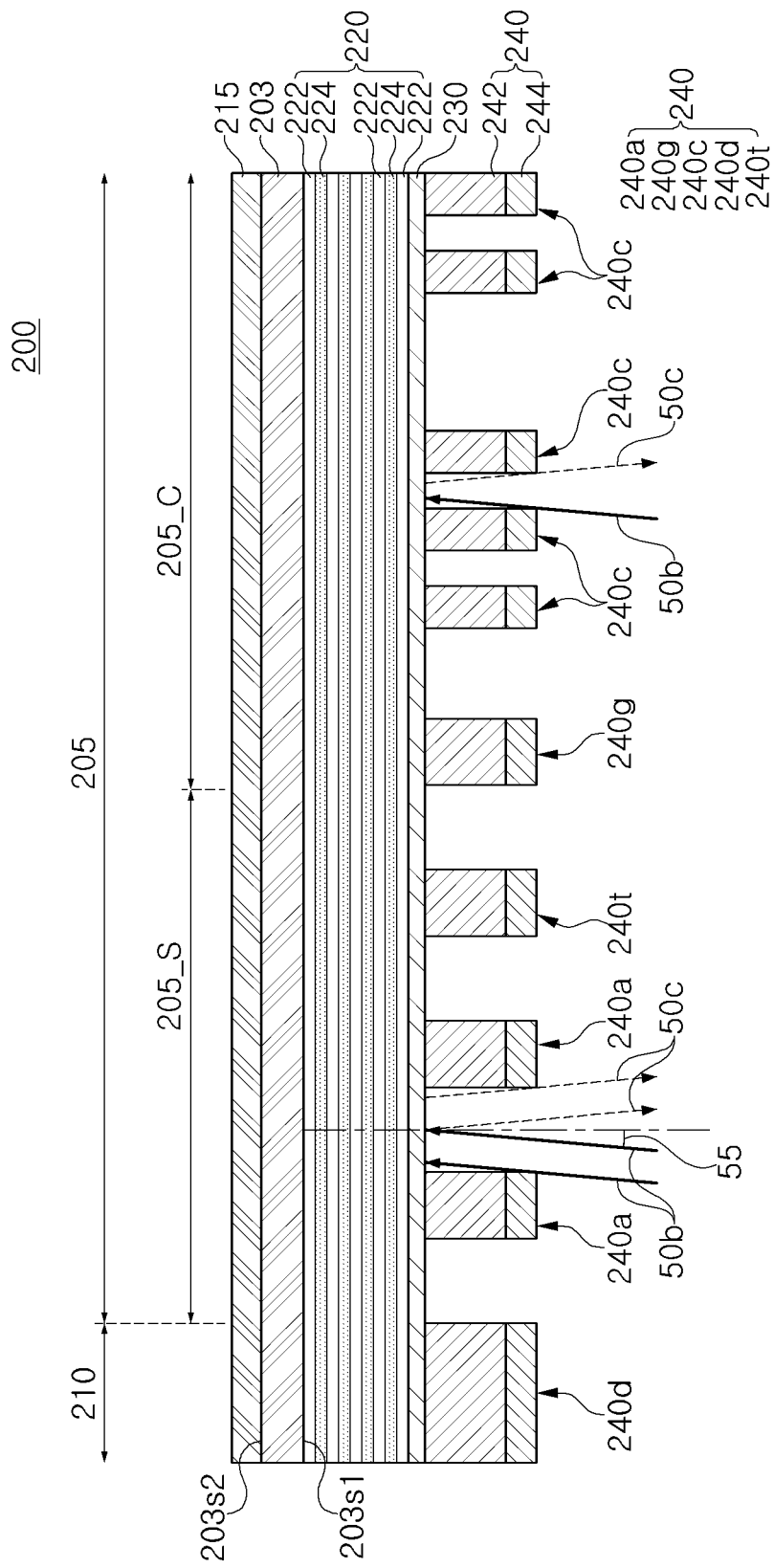
FIG. 5 is a cross-sectional view schematically illustrating an extreme ultraviolet (EUV) photomask for manufacturing a semiconductor device according to an embodiment.

With reference to FIG. 5, an extreme ultraviolet (EUV) photomask for manufacturing a semiconductor device according to an embodiment will be described.

FIG. 5 is a cross-sectional view schematically illustrating an extreme ultraviolet (EUV) photomask for manufacturing a semiconductor device according to an embodiment.

Referring to FIG. 5, an extreme ultraviolet (EUV) photomask 200 may include a mask substrate 203, a stack structure 220 disposed below the mask substrate 203, a backside layer 215 disposed on the stack structure 220, a capping layer 230 disposed below the stack structure 220, and a plurality of mask patterns 240 disposed below the capping layer 230. For example, the mask substrate 203 may have a first surface 203s1 and a second surface 203s2, opposing each other, the stack structure 220 may be disposed on the first surface 203s1 of the mask substrate 203, the capping layer 230 may be disposed on the stack structure 220, the plurality of mask patterns 240 may be disposed on the capping layer 230, and the backside layer 215 may be in contact with the second surface 203s2 of the mask substrate 203.

The mask substrate 203 may include a low thermal expansion material (LTEM). For example, the mask substrate 203 may include a silicon material.

The stack structure 220 may include a silicon layer 222 and a metal layer 224, alternately and repeatedly stacked. The metal layer 224 may be a molybdenum layer. The capping layer 230 may be a ruthenium layer.

Each of the mask patterns 240 may include a first mask pattern 242 contacting the capping layer 230, and a second mask pattern 244 below the first mask pattern 242. The first mask pattern 242 may be an absorber including a TaBN material. The second mask pattern 244 may be an antireflection layer including a lawrencium material.

In some embodiments, the second mask pattern 244 may be omitted.

In embodiments, the terms "on" or "above" and "below" may be used to explain a vertical positional relationship of components based on the cross-sectional view of FIG. 5, and the terms "on" or "above" and "below" may be replaced with the terms "below" and "on" or "above," or may be replaced with the terms "first" and "second," depending on a viewing direction.

The extreme ultraviolet (EUV) photomask 200 may include a mask layout region 205 and a border region 210 surrounding the mask layout region 205. The mask layout region 205 may be a region in which a mask layout pattern of the extreme ultraviolet (EUV) photomask 200 is formed. The border region 210 may be a region surrounding the mask layout region 205, and may be a region in which the mask layout pattern is not formed. As illustrated in FIG. 1, the second light 50b, incident on the photomask 200, and the third light 50c, reflected from the photomask 200, may be inclined about an axis, perpendicular to a surface of the photomask 200.

The mask layout region 205 of the extreme ultraviolet (EUV) photomask 200 may include a mask chip region 205_C and a mask scribe lane region 205_S surrounding the mask chip region 205_C.

In embodiments, the mask chip region 205_C may be referred to as an "extreme ultraviolet (EUV) mask chip region", and the mask scribe lane region 205_S may be referred to as an "extreme ultraviolet (EUV) mask scribe lane region."

The mask patterns 240 may include mask circuit layout patterns 240c formed in the mask chip region 205_C, a guard ring layout pattern 240g disposed in a portion of the mask chip region 205_C adjacent to the mask scribe lane region 205_S, mask alignment layout patterns 240a and test layout patterns 240t formed in the mask scribe lane region 205_S, and a border mask pattern 240d formed in the border region 210. In some embodiments, the mask patterns 240 may omit the guard ring layout pattern 240g.

In some embodiments, an angle 55 between the second light 50b, incident on the photomask 200, and an axis, perpendicular to a surface of the photomask 200, may be about 5 degrees to about 10 degrees.

In other embodiments, the angle 55 may be about 5 degrees to about 7 degrees. For example, in still other embodiments, the angle 55 may be about 6 degrees.

A first photomask and a second photomask, for manufacturing a semiconductor device according to an embodiment, will be illustrated with reference to FIGS. 6A and 6B.

Figure 6A:
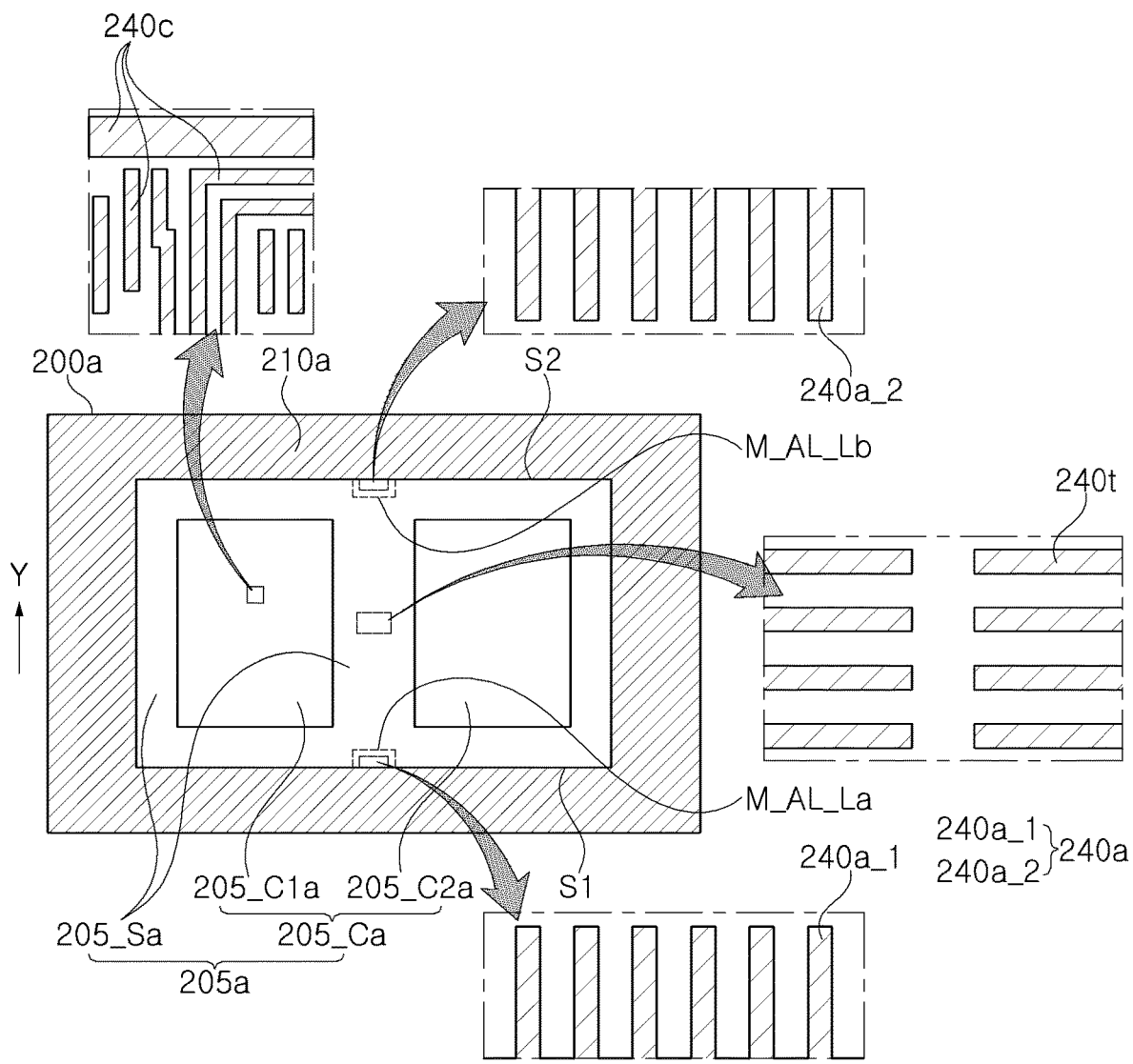
FIG. 6A is a plan view schematically illustrating a first photomask for manufacturing a semiconductor device according to an embodiment.
Figure 6B:
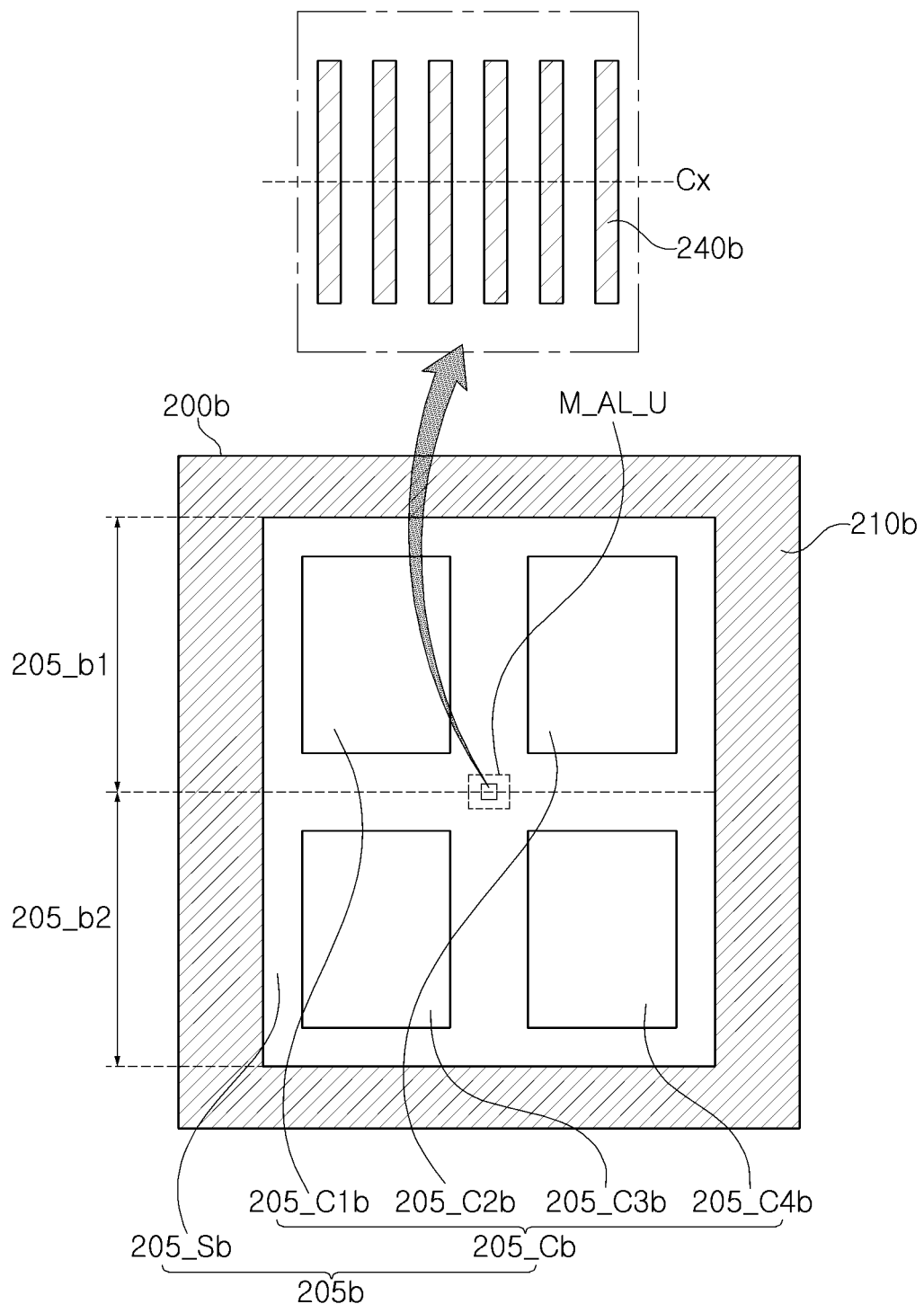
FIG. 6B is a plan view schematically illustrating a second photomask for manufacturing a semiconductor device according to an embodiment.

FIG. 6A is a plan view schematically illustrating a first photomask for manufacturing a semiconductor device according to an embodiment, and FIG. 6B is a plan view schematically illustrating a second photomask for manufacturing a semiconductor device according to an embodiment.

Referring to FIG. 6A, a first photomask 200a according to some embodiments may be an EUV photomask. The first photomask 200a may include a mask layout region 205a and a border region 210a surrounding the mask layout region 205a.

The mask layout region 205a may include 'N' mask chip regions 205_Ca and a first mask scribe lane region 205_Sa surrounding each of 'N' mask chip regions 205_Ca. 'N' may be a natural number of 2 or more. For example, the mask chip regions 205_Ca may include a first mask chip region 205_C1a and a second mask chip region 205_C2a.

The mask chip regions 205_Ca and the first mask scribe lane region 205_Sa may be arranged on the first surface 203s1 of the mask substrate 203 illustrated in FIG. 5.

In each of 'N' mask chip regions 205_Ca (i.e., in each of the first mask chip region 205_C1a and the second mask chip region 205_C2a), the mask circuit layout patterns 240c illustrated in FIG. 5 may be disposed.

The test layout pattern 240t illustrated in FIG. 5 may be disposed in the first mask scribe lane region 205_Sa. The test layout pattern 240t may be a test layout pattern of a test element group.

A first mask alignment mark region M_AL_La and a second mask alignment mark region M_AL_Lb, spaced apart from each other, may be disposed in the first mask scribe lane region 205_Sa.

The mask layout region 205a may have a first side S1 and a second side S2, opposing each other. In this case, the first side S1 and the second side S2 of the mask layout region 205a may also be described as a first side S1 and a second side S2 of the first mask scribe lane region 205_Sa. Therefore, the first and second sides S1 and S2 of the mask layout region 205a may be replaced with and described as the first and second sides S1 and S2 of the first mask scribe lane region 205_Sa.

The first mask alignment mark region M_AL_La may be adjacent to a central area of the first side S1 of the mask layout region 205a, and the second mask alignment mark region M_AL_Lb may be adjacent to a central area of the second side S2 of the mask layout region 205a. For example, in the top view as illustrated in FIG. 6A, the first mask alignment mark region M_AL_La may be disposed to be adjacent to a lower edge, e.g., the central area of the first side S1 of the mask layout region 205a, and the second mask alignment mark region M_AL_Lb may be disposed to be adjacent to an upper edge, e.g., the central area of the second side S2 of the mask layout region 205a.

A first mask alignment layout pattern 240a_1 may be disposed in the first mask alignment mark region M_AL_La, and a second mask alignment layout pattern 240a_2 may be disposed in the second mask alignment mark region M_AL_Lb. Therefore, the mask alignment layout pattern 240a illustrated in FIG. 5 may include the first and second mask alignment layout patterns 240a_1 and 240a_2 disposed in the first mask scribe lane region 205_Sa.

In some embodiments, the first mask alignment layout pattern 240a_1 may have a same shape as a shape of the second mask alignment layout pattern 240a_2. That is, the first mask alignment layout pattern 240a_1 and the second mask alignment layout pattern 240a_2 may have the same shape. For example, the first mask alignment layout pattern 240a_1 and the second mask alignment layout pattern 240a_2 may be line patterns, parallel to each other. In this case, the line patterns may be referred to as bar patterns. The line patterns of the first mask alignment layout pattern 240a_1 and the second mask alignment layout pattern 240a_2 may extend in a first direction Y, and the first mask alignment mark region M_AL_La including the first mask alignment layout pattern 240a_1 and the second mask alignment mark region M_AL_Lb including the second mask alignment layout pattern 240a_2 may be spaced apart from each other in the first direction Y. The first direction Y may be perpendicular to the first and second sides S1 and S2 of the first mask scribe lane region 205_Sa.

In some embodiments, the first mask alignment layout pattern 240a_1 and the second mask alignment layout pattern 240a_2 may have different shapes and/or different numbers of line patterns.

Referring to FIG. 6B, a second photomask 200b according to some embodiments may be an EUV photomask or a transmissive photomask.

The second photomask 200b may include a mask layout region 205b and a border region 210b surrounding the mask layout region 205b.

The mask layout region 205b may include 'M' mask chip regions 205_Cb and a second mask scribe lane region 205_Sb surrounding each of the 'M' mask chip regions 205_Cb. 'M' may be twice 'N' illustrated in FIG. 6A. That is, 'M' may be two times 'N' such that M=2*N. For example, 'N' may be 2, and 'M' may be 4. For example, the mask chip regions 205_Cb may include a first mask chip region 205_C1b, a second mask chip region 205_C2b, a third mask chip region 205_C3b, and a fourth mask chip region 205_C4b.

The mask layout region 205b may include an upper mask layout region 205_b1 and a lower mask layout region 205_b2, having a mirror symmetric structure. For example, the upper mask layout region 205_b1 may include 'N' mask chip regions 205_Cb, for example the first mask chip region 205_C1b and the second mask chip region 205_C2b, and the lower mask layout region 205_b2 may include 'N' mask chip regions 205_Cb, for example the third mask chip regions 205_C3b and the fourth mask chip region 205_C4b.

A central mask alignment mark region M_AL_U may be disposed in a central area of the mask layout region 205b.

In the top view as illustrated in FIG. 6B, a horizontal axis Cx passing through a center of the mask layout region 205b may pass through a central portion of the central mask alignment mark region M_AL_U.

An upper mask alignment layout pattern 240b may be disposed in the central mask alignment mark region M_AL_U.

In some embodiments, the upper mask alignment layout pattern 240b may be line patterns parallel to each other, or bar patterns parallel to each other.

an example of a semiconductor wafer WF for manufacturing a semiconductor device according to some embodiments embodiment will be illustrated with reference to FIGS. 7 and 8.

Figure 7:
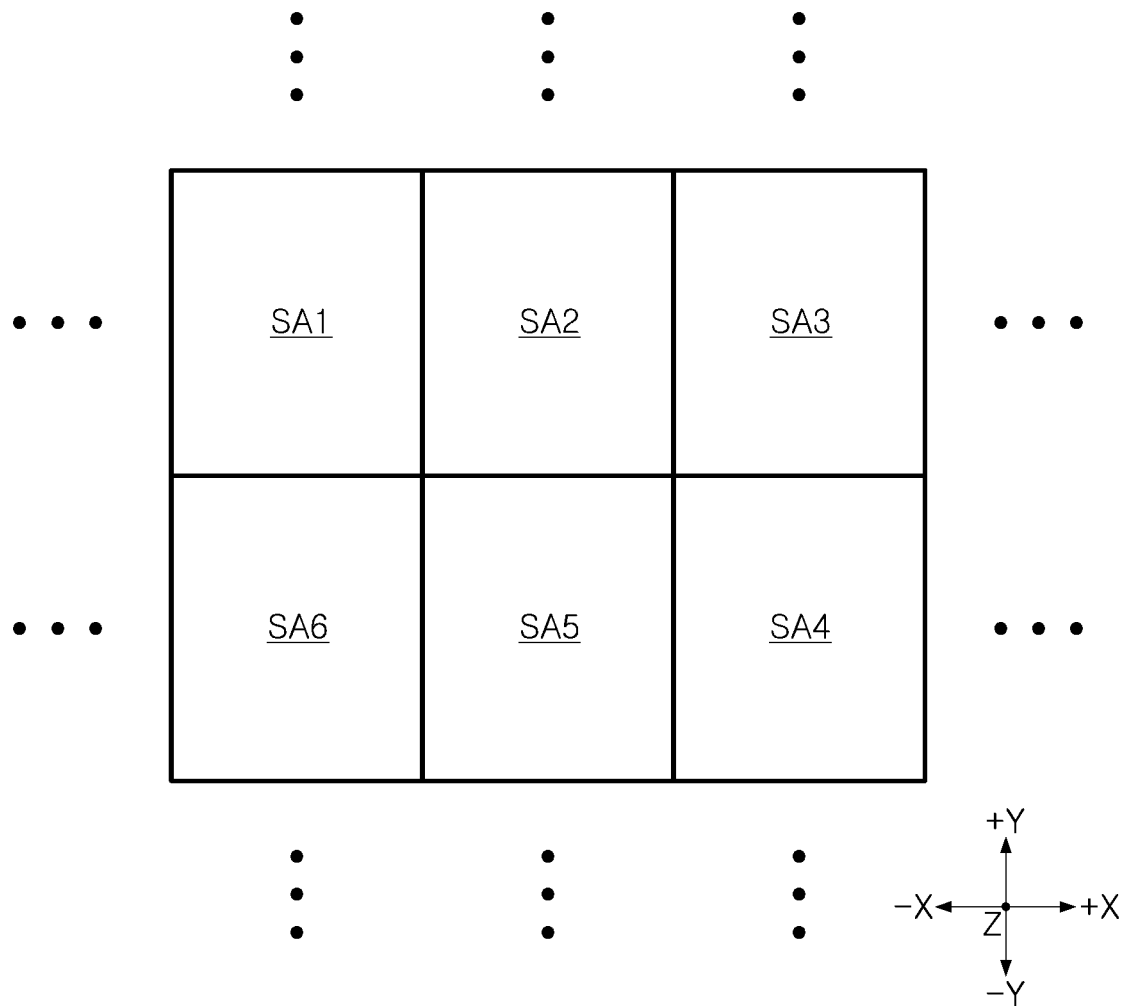
FIG. 7 is a plan view schematically illustrating a plurality of shot regions of a semiconductor wafer for manufacturing a semiconductor device according to an embodiment.
Figure 8:
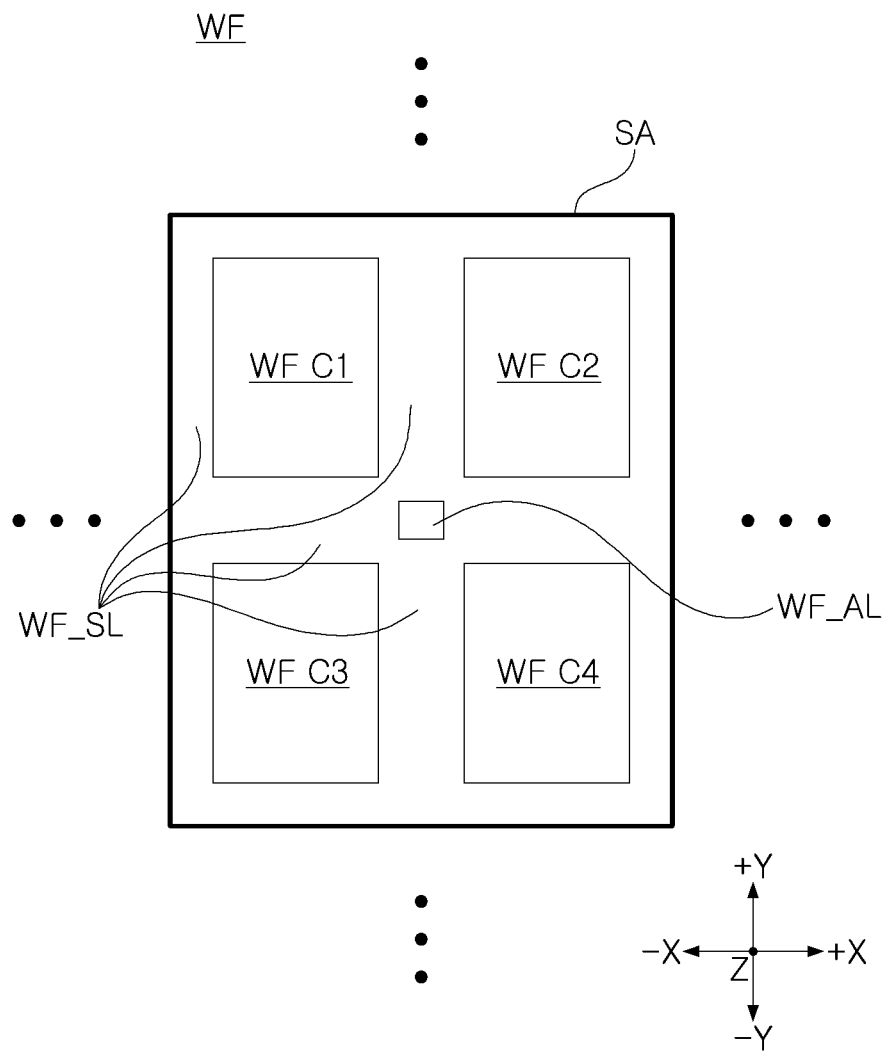
FIG. 8 is a plan view schematically illustrating one shot region of a semiconductor wafer for manufacturing a semiconductor device according to an embodiment.

FIG. 7 is a plan view schematically illustrating a plurality of shot regions of a semiconductor wafer for manufacturing a semiconductor device according to an embodiment, and FIG. 8 is a plan view schematically illustrating one shot region among the plurality of shot regions illustrated in FIG. 7.

Referring to FIGS. 7 and 8, a semiconductor wafer WF according to some embodiments may include a plurality of shot regions SA arranged in a row direction (+X direction or −X direction) and a column direction (+Y direction or −Y direction). For example, FIG. 7 shows shot regions SA1-SA6. As illustrated in FIG. 8, each shot region SA may include a plurality of wafer chip regions. For example, one shot region SA among the plurality of shot regions SA may include a plurality of wafer chip regions WF_C1, WF_C2, WF_C3, and WF_C4 and a wafer scribe lane region WF_SL surrounding each of the plurality of wafer chip regions WF_C1, WF_C2, WF_C3, and WF_C4.

As illustrated in FIG. 7, the plurality of shot regions SA may include a first shot region SA1, a second shot region SA2, and a third shot region SA3, sequentially arranged in the +X direction. The plurality of shot regions SA may further include a sixth shot region SA6 disposed adjacent to the first shot region SA1 in the −Y direction, a fifth shot region SA5 disposed adjacent to the second shot region SA2 in the −Y direction, and a fourth shot region SA4 disposed adjacent to the third shot region SA3 in the −Y direction.

The number of the plurality of wafer chip regions WF_C1, WF_C2, WF_C3, and WF_C4 may be the same as the 'M' mask chip regions 205_Cb, illustrated in FIG. 6B. Therefore, the plurality of wafer chip regions WF_C1, WF_C2, WF_C3, and WF_C4 may be 'M'.

As illustrated in FIG. 8, the one shot region SA may include a wafer alignment region WF_AL disposed in a central portion of the one shot region SA. The wafer alignment region WF_AL may be disposed in a wafer scribe lane region WF_SL.

The operation S20a of performing a first semiconductor process using a first photomask on a semiconductor wafer, illustrated with reference to FIG. 2C, will be illustrated with reference to FIGS. 9A and 9B together with FIGS. 4A and 6A.

Figure 9A:
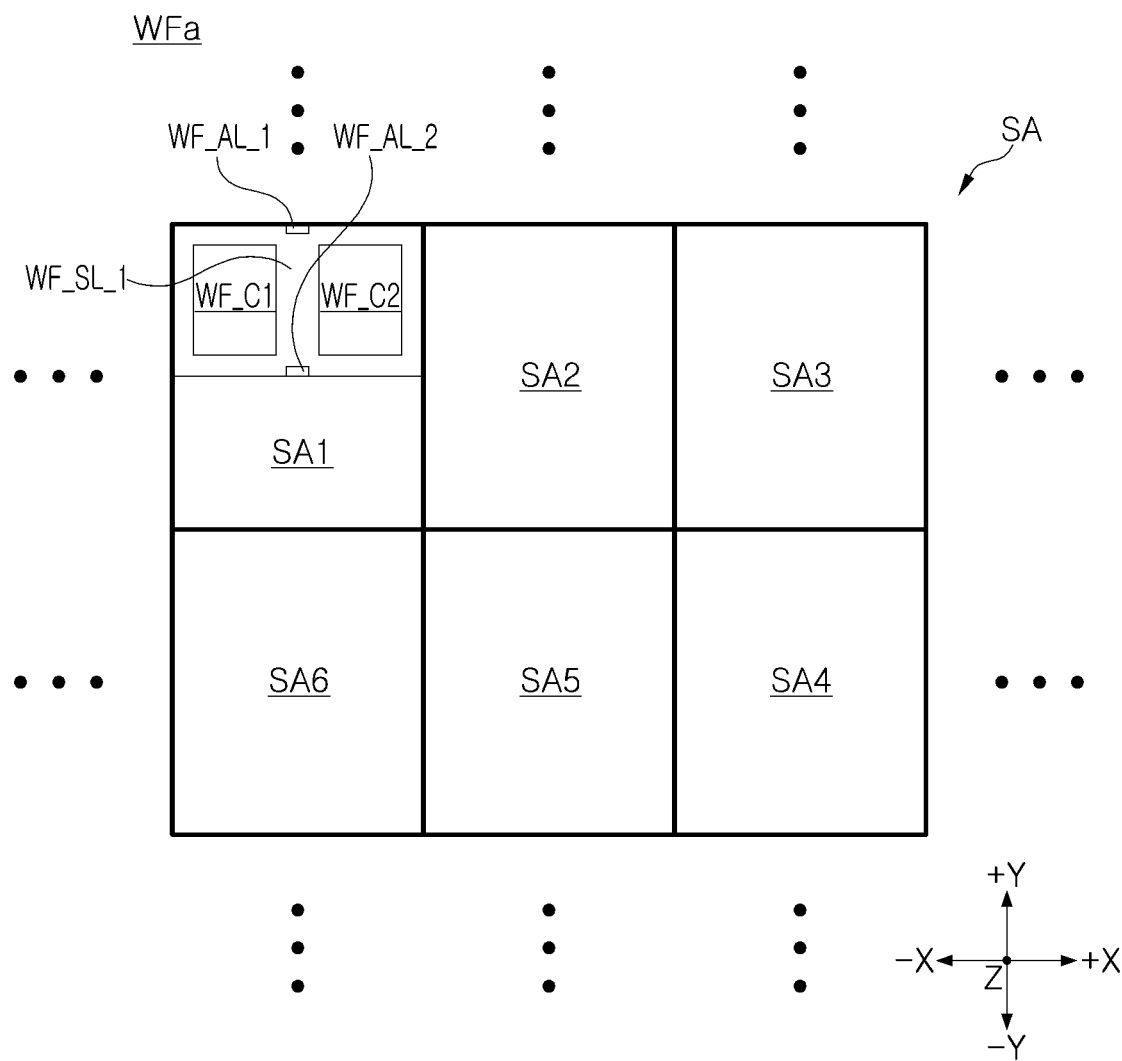
FIGS. 9A and 9B are plan views illustrating exposing a plurality of shot regions of a semiconductor wafer for manufacturing a semiconductor device according to an embodiment by a first photolithography process.
Figure 9B:
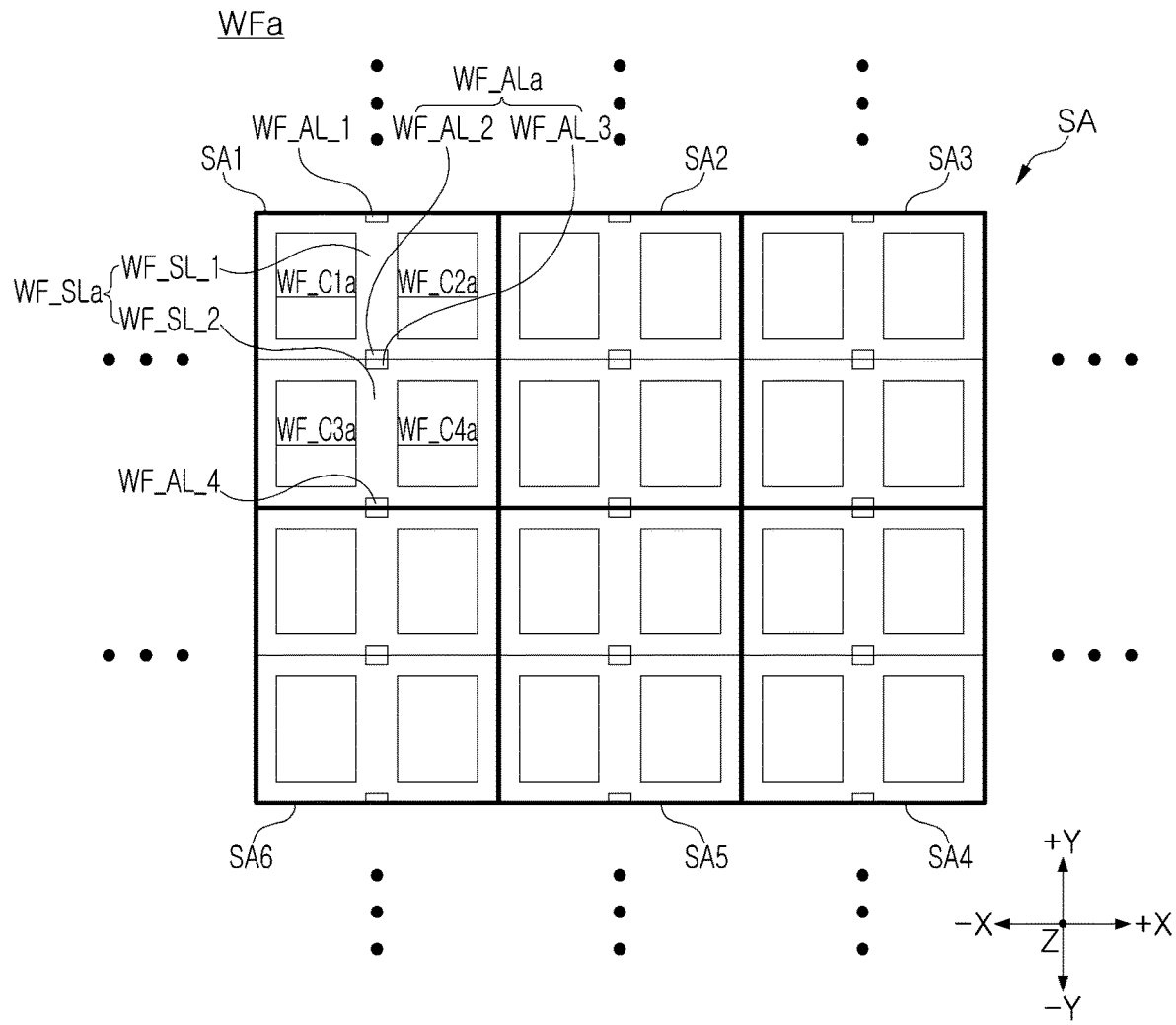

FIGS. 9A and 9B are plan views illustrating exposing a plurality of shot regions of a semiconductor wafer for manufacturing a semiconductor device according to an embodiment by a first photolithography process.

Referring to FIGS. 9A and 9B together with FIGS. 2C, 4A, and 6A, in operation S20a of performing the first semiconductor process using the first photomask on the semiconductor wafer illustrated with reference to FIG. 2C, the semiconductor wafer may be a semiconductor wafer WFa, which may include the plurality of shot regions SA such as the semiconductor wafer WF, illustrated in FIGS. 7 and 8. For example, in the semiconductor wafer WFa, each of the plurality of shot regions SA may include the plurality of wafer chip regions WF_C1, WF_C2, WF_C3, and WF_C4 as illustrated in FIG. 8 and the wafer scribe lane region WF_SL surrounding each of the plurality of wafer chip regions WF_C1, WF_C2, WF_C3, and WF_C4.

The semiconductor wafer WFa may have the first photoresist layer (e.g., 120 of FIG. 4A) formed on a surface thereof. The first photomask may be one of the first photomasks illustrated with reference to FIGS. 5 and 6A (200 of FIGS. 5 and 200a of FIG. 6A).

The operation S20a of performing the first semiconductor process using the first photomask (e.g., 200 of FIGS. 5 and 200a of FIG. 6A) on the semiconductor wafer WFa may include S120 performing one shot process, including wafer alignment and light irradiation by a light source, sequentially a plurality of times, to expose the photoresist layer (120 in FIG. 4A) of the semiconductor wafer 100, illustrated in FIGS. 3 and 4A to 4C.

In operation S20a of performing the first semiconductor process using the first photomask (200 of FIGS. 5 and 200a of FIG. 6A) on the semiconductor wafer WFa, the one shot process may be performed with respect to any one shot region of the semiconductor wafer WFa, for example, a half area of the first shot region SA1. For example, a first shot process may expose approximately half of the photoresist layer (120 of FIG. 4A) in the first shot region SA1. In this case, a half area of the first shot region SA1 may be a half of the "m" wafer chip regions WF_C1, WF_C2, WF_C3, and WF_C4 in the first shot region SA1 formed by one first shot process, e.g., a region including the "n" wafer chip regions.

In operation S20a of performing the first semiconductor process using the first photomask (200 of FIGS. 5 and 200a of FIG. 6A) on the semiconductor wafer WFa, a method of exposing the photoresist layer (120 of FIG. 4A) of shot regions arranged in any one row direction (+X direction), for example, the first to third shot regions SA1, SA2, and SA3 (see FIG. 7), will be described.

After performing the first shot process twice to expose an upper area of the first shot region SA1, for example, wafer chip regions WF_C1 and WF_C2 of the plurality of wafer chip regions WF_C1, WF_C2, WF_C3, and WF_C4 in one shot region, the wafer stage (150 of FIG. 1) illustrated in FIG. 1 may be used to move the semiconductor wafer WFa in the –X direction such that the second shot region SA2 may be moved to a position in which the first shot region SA1 was located. After aligning the semiconductor wafer WFa, the first shot process may be performed twice on an upper area of the second shot region SA2 to expose WF_C1 and WF_C2 of the second shot region SA2. The wafer stage may then be used to move the semiconductor wafer WFa again in the –X direction such that the third shot region SA3 may be moved to a position in which the first shot region SA1 was located. After aligning the semiconductor wafer WFa, the first shot process may be performed twice on an upper area of the third shot region SA3 to expose WF_C1 and WF_C2 of the third shot region SA3. After sequentially performing the first shot process to each of the plurality of shot regions arranged in the +X direction (in this example SA1-SA3), the semiconductor wafer WFa may be moved using the wafer stage (150 of FIG. 1) in the +Y direction, and remaining half of the third shot region SA3, remaining half of the second shot region SA2, and remaining half of the first shot region SA1 may be sequentially exposed in a similar manner while sequentially moving the semiconductor wafer WFa in the –X direction. In other words, WF_C1, WF_C2 of SA1, WF_C1, WF_C2 of SA2, WF_C1, WF_C2 of SA3, WF_C3, WF_C4 of SA3, WF_C3, WF_C4 of SA2, and WF_C3, WF_C4 of SA1 may be exposed in that order. It is noted that, in the example of FIGS. 9A and 9B, the upper half of the shot regions SA are exposed first and then the lower half of the shot regions SA. However, this is only an example and, in other embodiments, the lower half of the shot regions SA may be exposed first and then the upper half thereof.

In this case, the upper area of the shot region may denote a half planar area of the shot region located in the +Y direction in the top view, and the lower area of the shot region may denote a half planar area of the shot region located in the –Y direction in the top view.

Two shot processes may be performed in any one shot region of the semiconductor wafer WFa, for example, the first shot region SA1, to expose the photoresist layer (120 of FIG. 4A) of the first shot region SA1.

In some embodiments, 'N' wafer chip regions formed by transferring 'N' mask chip regions 205_Ca illustrated in FIG. 6A into the upper area of the first shot region SA1, for example, wafer chip regions denoted by WF_C1 and WF_C2 as in FIG. 8, and a first wafer scribe lane region WF_SL 1 formed by transferring the first mask scribe lane region 205_Sa illustrated in FIG. 6A, may be formed. Similarly, the 'N' wafer chip regions formed by transferring the 'N' mask chip regions 205_Ca illustrated in FIG. 6A into the lower area of the first shot region SA1, for example, wafer chip regions denoted by WF_C3 and WF_C4 as in FIG. 8, and a second wafer scribe lane region WF_SL 2 formed by transferring the first mask scribe lane region 205_Sa illustrated in FIG. 6A, may be formed. Therefore, the first shot region SA1 may include a wafer scribe lane region WF_SLa including the first and second wafer scribe lane regions WF_SL 1 and WF_SL 2, and. the wafer chip regions (WF_C1a, WF_C2a, WF_C3a, and WF_C4a in FIG. 9B) formed as twice 'n,' e.g., as many as 'm,' as illustrated in FIG. 6B.

Any one shot region of the semiconductor wafer WFa, for example, the first shot region SA1 may include a first wafer alignment mark region WF_AL_1 and a second wafer alignment mark region WF_AL_2, formed by transferring the first mask alignment mark region M_AL_La and the second mask region M_AL_Lb, illustrated in FIG. 6A, by the shot process performed on the upper half of the wafer chip regions of the first shot region SA1, and may include a third wafer alignment mark region WF_AL_3 and a fourth wafer alignment mark region WF_AL_4, formed by transferring the first mask alignment mark region M_AL_La and the second mask region M_AL_Lb, illustrated in FIG. 6A, by the shot process performed on the lower half of the wafer chip regions of the first shot region SA1.

The first wafer alignment mark region WF_AL_1 and the second wafer alignment mark region WF_AL_2 may be spaced apart from each other in the +Y direction. The third wafer alignment mark region WF_AL_3 and the fourth wafer alignment mark region WF_AL_4 may be spaced apart from each other in the +Y direction. Within the first shot region SA1, the second and third wafer alignment mark regions WF_AL_2 and WF_AL_3 may be adjacent to or overlap each other, to form a lower central wafer alignment mark region WF_ALa.

In the first shot region SA1, the first wafer alignment mark region WF_AL_1 may be disposed adjacent to a central portion of an upper edge of the first shot region SA1, and the fourth wafer alignment mark region WF_AL_4 may be disposed adjacent to a central portion of a lower edge of the first shot region SA1. The lower central wafer alignment mark region WF_ALa may be disposed in a central portion between the first wafer alignment mark region WF_AL_1 and the fourth wafer alignment mark region WF_AL_4.

The method of exposing the photoresist layer (120 of FIG. 4A) of shot regions arranged in any one row direction (+X direction), for example, the first to third shot regions SA1, SA2, and SA3 (see FIG. 7), has been described. However, it will be understood that a similar method may be used for exposing the photoresist layer (120 of FIG. 4A) of shot regions arranged in other rows of the semiconductor wafer WFa. For example, a similar manner may be used to expose the sixth to fourth shot regions SA6, SA5, SA4, as well as other rows.

Next, the operation S20b of performing a second semiconductor process using a second photomask on a semiconductor wafer, illustrated with reference to FIG. 2C, will be illustrated with reference to FIGS. 10A and 10B together with FIGS. 4A and 6B.

Figure 10A:
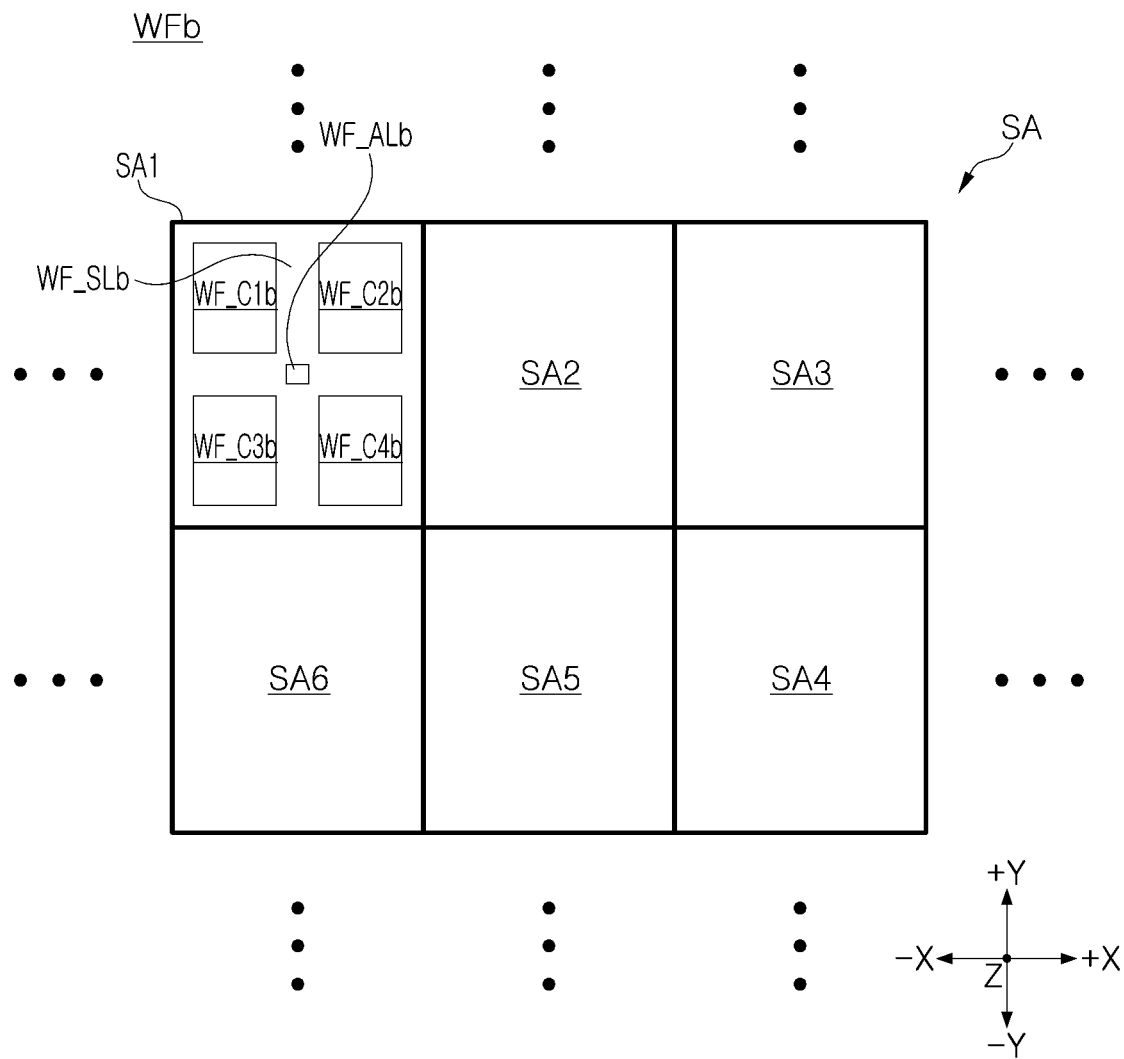
FIGS. 10A and 10B are plan views illustrating exposing a plurality of shot regions of a semiconductor wafer for manufacturing a semiconductor device according to an embodiment by a second photolithography process.
Figure 10B:
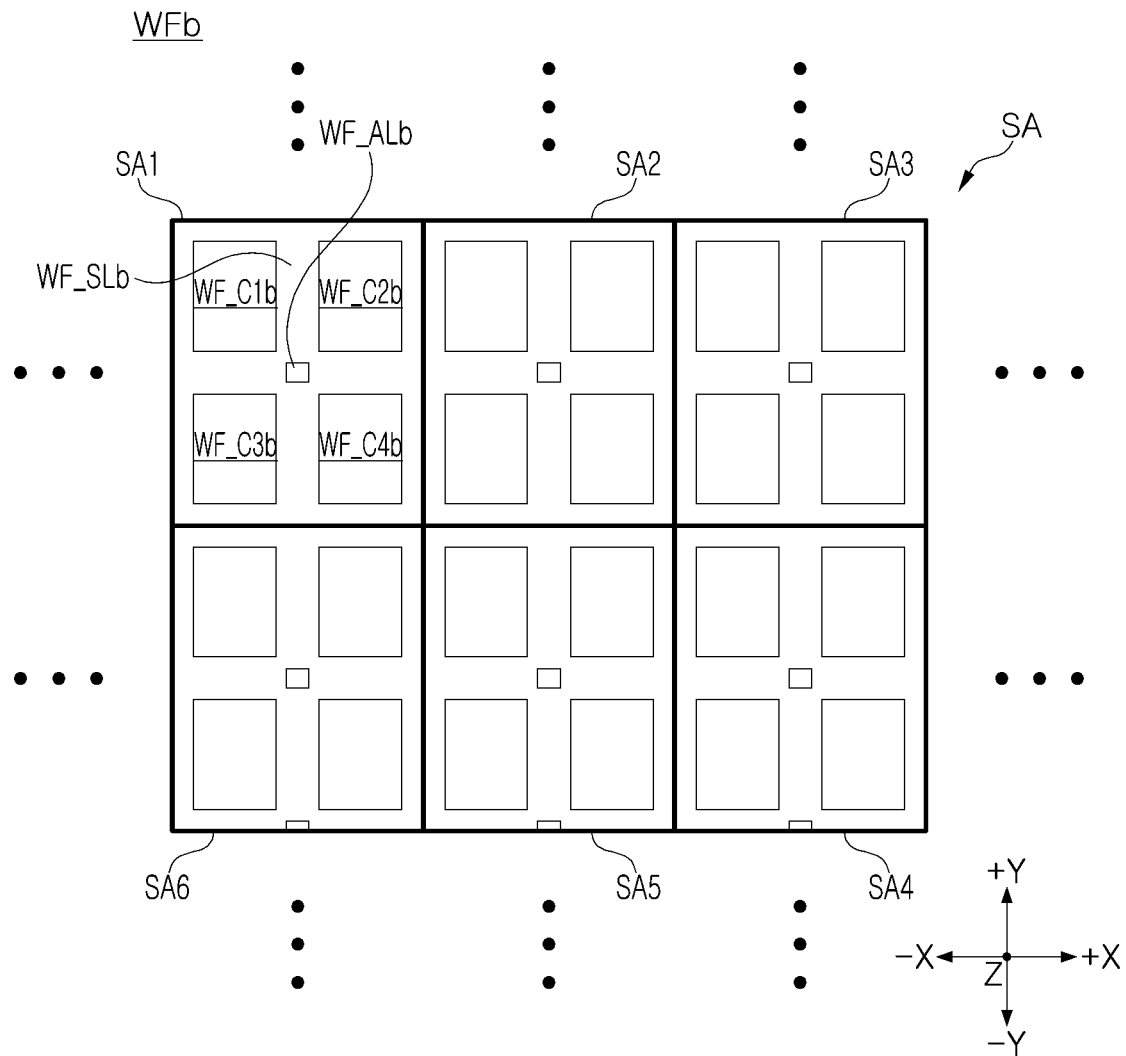

FIGS. 10A and 10B are plan views illustrating exposing a plurality of shot regions of a semiconductor wafer for manufacturing a semiconductor device according to an embodiment by a second photolithography process.

Referring to FIGS. 10A and 10B together with FIGS. 2C, 4A, and 6B, in operation S20b of performing the second semiconductor process using the second photomask on the semiconductor wafer illustrated with reference to FIG. 2C, the semiconductor wafer may be a semiconductor wafer WFb in which other layers are formed to perform the second semiconductor process on the semiconductor wafer WFa illustrated in FIGS. 9A and 9B, after the operation S20a of performing the first semiconductor process using the first photomask (200a in FIG. 6A). For example, in operation S20b of performing the second semiconductor process using the second photomask, the semiconductor wafer WFb may be a wafer on which a second photoresist layer is formed on the semiconductor wafer WFa that has been exposed as illustrated in FIGS. 9A and 9B. In this case, the second photoresist layer may be understood as the photoresist layer 120 in FIG. 4A.

In operation S20b of performing the second semiconductor process using the second photomask on the semiconductor wafer illustrated with reference to FIG. 2C, the second photomask may be the second photomask (200b in FIG. 6B) illustrated in FIG. 6B. In some embodiments, the second photomask (200b of FIG. 6B) may be the photomask 200 as illustrated in FIG. 5. In another example, the second photomask (200b of FIG. 6B) may be a transmissive photomask.

The semiconductor wafer WFb may include the plurality of shot regions SA including the plurality of wafer chip regions WF_C1, WF_C2, WF_C3, and WF_C4 and the wafer scribe lane region WF_SL, identical to the semiconductor wafer WF in FIGS. 7 and 8.

In operation S20b of performing the second semiconductor process using the second photomask (200b in FIG. 6B) on the semiconductor wafer WFb, a second shot process may be performed in one shot region of the semiconductor wafers WFb, for example, in an entire region of the first shot region SA1. For example, in the second shot process, the photoresist layer (120 in FIG. 4A) of the first shot region SA1 may be entirely exposed. In this case, the entire region of the first shot region SA1 may be a region including "m" wafer chip regions WF_C1, WF_C2, WF_C3, and WF_C4 as illustrated in FIG. 8.

In operation S20b of performing the second semiconductor process using the second photomask (200b in FIG. 6B) on the semiconductor wafer WFb, a method of exposing the photoresist layer (120 of FIG. 4A) of shot regions arranged in any one row direction (+X direction), for example, the first to third shot regions SA1, SA2, and SA3, will be described.

In operation S20b of performing the second semiconductor process using the second photomask (200b in FIG. 6B) on the semiconductor wafer WFb, after performing the second shot process to expose the entire region of the first shot region SA1, for example, all of the plurality of wafer chip regions WF_C1, WF_C2, WF_C3, and WF_C4 in the first shot region SA1 at one time, the wafer stage (150 of FIG. 1) illustrated in FIG. 1 may be used to move the semiconductor wafer WFb in the −X direction, the second shot region SA2 may be moved to a position in which the first shot region SA1 was located, and after aligning the semiconductor wafer WFb, the second shot process may be performed once on the entire region of the second shot region SA2 to expose all of the plurality of wafer chip regions WF_C1, WF_C2, WF_C3, and WF_C4 in the second shot region SA2 at one time. The wafer stage (150 of FIG. 1) illustrated in FIG. 1 may be used to move the semiconductor wafer WFb again in the −X direction, the third shot region SA3 may be moved to a position in which the second shot region SA2 was located, and after aligning the semiconductor wafer WFb, the second shot process may be performed once on the entire region of the third shot region SA3 to expose all of the plurality of wafer chip regions WF_C1, WF_C2, WF_C3, and WF_C4 in the third shot region SA3 at one time. Thus, the second shot process performed once may be sequentially performed on each of the shot regions arranged in the +X direction. Therefore, the photoresist layer (120 of FIG. 4A) of the first to third shot regions SA1, SA2, and SA3 may be sequentially exposed.

In the same manner that the photoresist layer (120 in FIG. 4A) of the first to third shot regions SA1, SA2, and SA3 is sequentially exposed, the wafer stage (150 of FIG. 1) may be used to move the semiconductor wafer WFb in the +Y direction, the fourth shot region SA4, the fifth shot region SA5, and the sixth shot region SA6 may be sequentially exposed, while sequentially moving the semiconductor wafer WFb in the −X direction. The first shot region SA1 may include the wafer scribe lane region WF_SLb, and the wafer chip regions WF_C1b, WF_C2b, WF_C3b, and WF_C4b, formed as many as 'M' as illustrated in FIG. 6B.

Any one shot region of the semiconductor wafer WFb, for example, the first shot region SA1, may include an upper central wafer alignment mark region WF_ALb formed by transferring the central mask alignment mark region M_AL_U illustrated in FIG. 6B by the second shot process. In the first shot region SA1, the upper central wafer alignment mark region WF_ALb may be disposed in the central portion of the first shot region SA1.

As illustrated in FIGS. 9A and 9B, in the first shot region SA1 of the semiconductor wafer WFa, the second and third wafer alignment mark regions WF_AL_2 and WF_AL_3 may be adjacent to or overlap each other to form a lower central wafer alignment mark region WF_ALa. Hereinafter, an example of the lower central wafer alignment mark region WF_ALa including the second and third wafer alignment mark regions WF_AL_2 and WF_AL_3 adjacent to each other will be illustrated with reference to FIG. 11.

Figure 11:
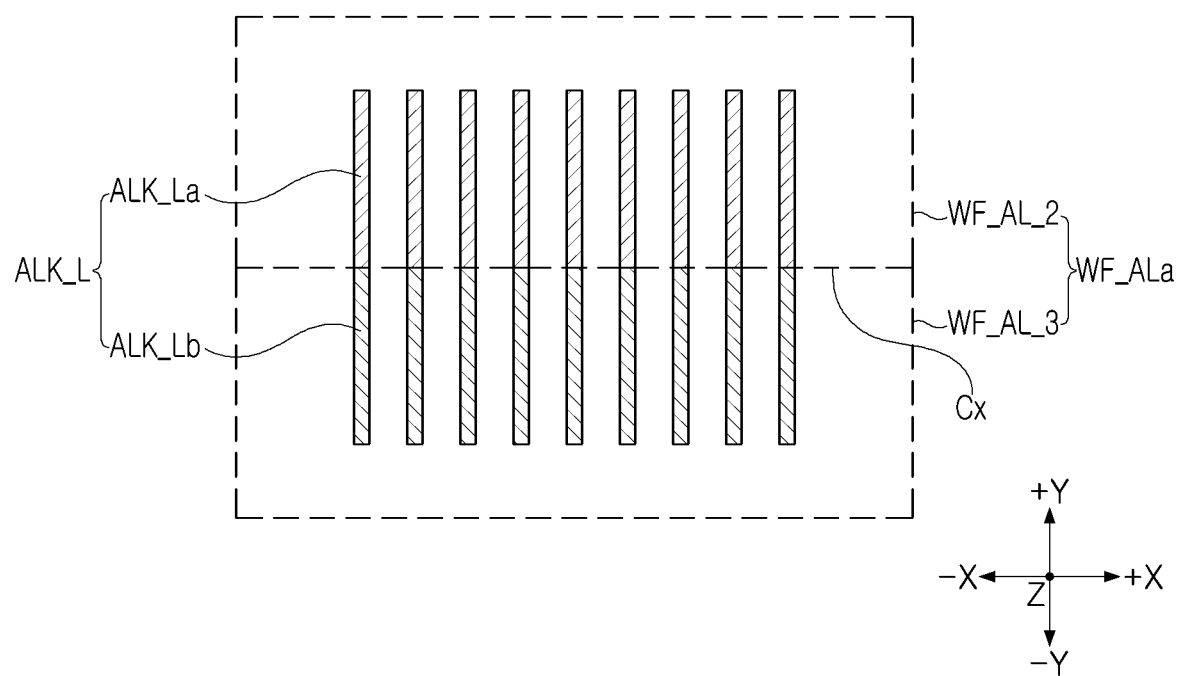
FIG. 11 is a top view schematically illustrating a wafer alignment mark formed using the first photolithography process of FIGS. 9A and 9B, according to an embodiment.

Referring to FIG. 11, the lower central wafer alignment mark region WF_ALa of the semiconductor wafer WFa, as illustrated in FIGS. 9A and 9B, may include a wafer alignment mark ALK_L including a first lower wafer alignment mark ALK_La in the second wafer alignment mark region WF_AL_2 formed by the first shot process performed on the upper half of the wafer chip regions of the one shot region, and a second lower wafer alignment mark ALK_Lb in the third wafer alignment mark region WF_AL_3 formed by the first shot process performed on the lower half of the wafer chip regions of the one shot region.

In some embodiments, the first lower wafer alignment mark ALK_La and the second lower wafer alignment mark ALK_Lb may have a symmetrical structure with respect to a central horizontal axis Cx.

The first lower wafer alignment mark ALK_La and the second lower wafer alignment mark ALK_Lb may be alignment patterns having a linear shape or a bar shape and extending in the +Y direction.

In some embodiments, the first lower wafer alignment mark ALK_La may have a shape extending from the second lower wafer alignment mark ALK_Lb in the +Y direction. Therefore, the lower wafer alignment mark ALK_L may be an alignment pattern having a linear shape or a bar shape.

Next, with reference to FIGS. 12A to 12F, respectively, various modified examples of the lower wafer alignment mark ALK_L, including patterns of the first lower wafer alignment mark ALK_La formed by the former first shot process and patterns of the second lower wafer alignment mark ALK_Lb formed by the latter first shot process, as illustrated in FIG. 11, will be described.

Figure 12A:
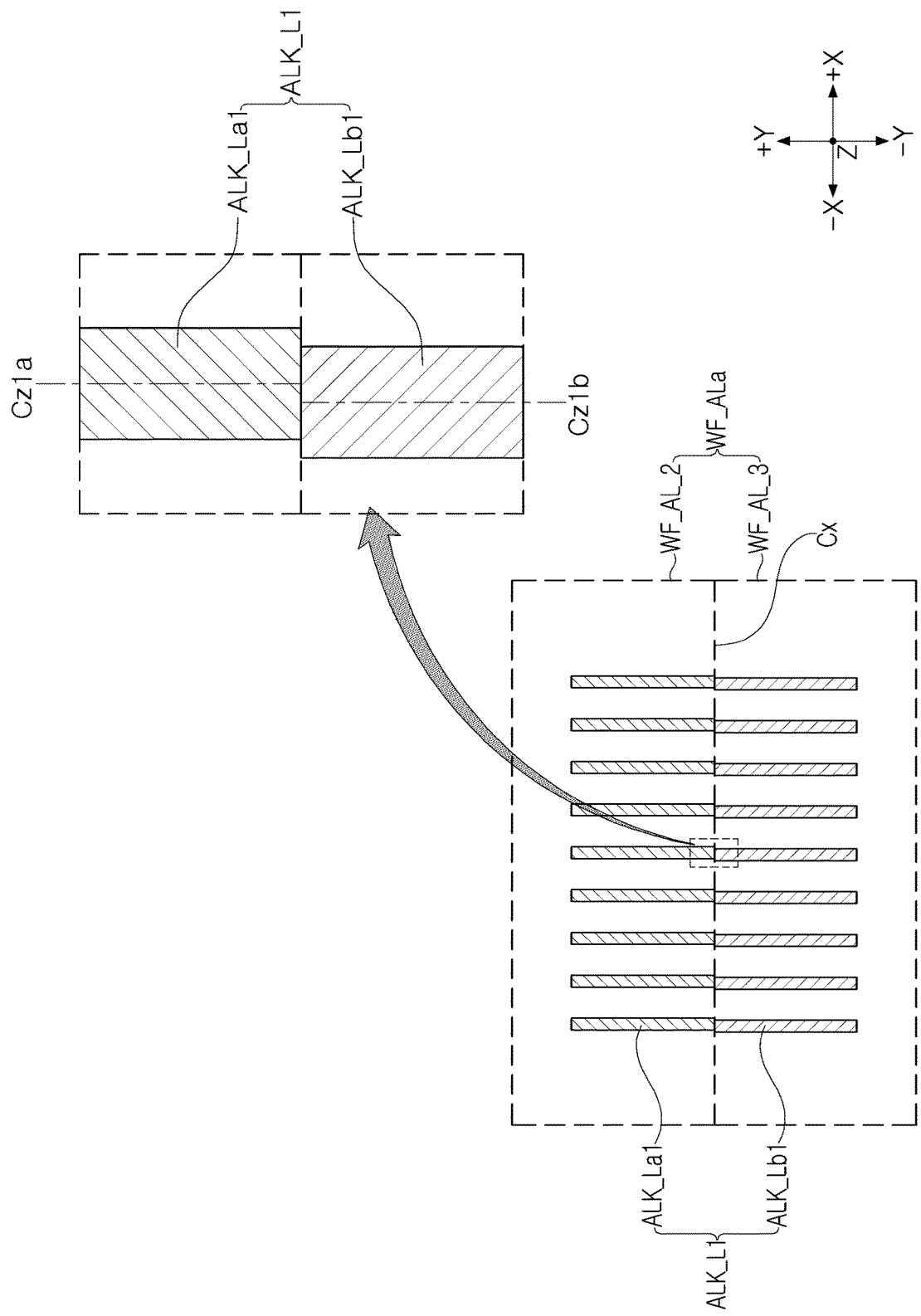
FIGS. 12A to 12F are top views schematically illustrating modified examples of a wafer alignment mark formed using the first photolithography process of FIGS. 9A and 9B, according to various embodiments.

In a modified example, referring to FIG. 12A, a lower wafer alignment mark ALK_L1 in the modified example may include alignment patterns of a first lower wafer alignment mark ALK_La1 and alignment patterns of a second lower wafer alignment mark ALK_Lb1, both being continuous in the +Y direction, but, in which central axes Cz1a and Cz1b are not aligned in the +Y direction. For example, the central axes CZ1a of the alignment patterns of the first lower wafer alignment mark ALK_La1 in the +Y direction and the central axes CZ1b of the alignment patterns of the second lower wafer alignment mark ALK_Lb1 in the +Y direction, adjacent to each other in the +Y direction, may not be aligned. The alignment patterns of the first lower wafer alignment mark ALK_La1 and the alignment patterns of the second lower wafer alignment mark ALK_Lb1 may have a linear shape or a bar shape extending in the +Y direction, respectively.

Figure 12B:
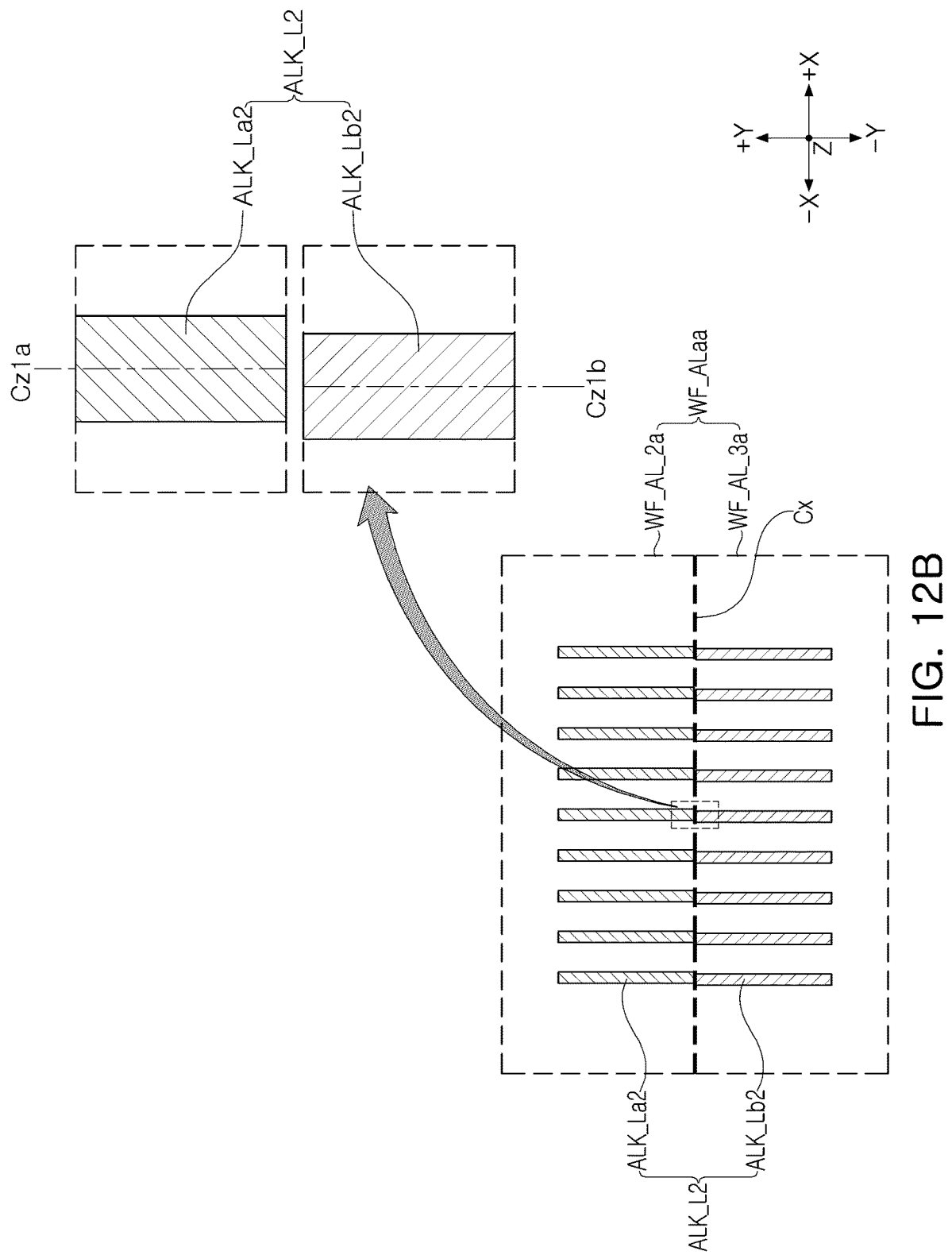

In a modified example, referring to FIG. 12B, a lower wafer alignment mark ALK_L2 in the modified example may include alignment patterns of a first lower wafer alignment mark ALK_La2 and alignment patterns of a second lower wafer alignment mark ALK_Lb2, adjacent to each other in the +Y direction, but spaced apart from each other in the +Y direction. Therefore, a lower central wafer alignment mark region WF_ALaa including the lower wafer alignment mark ALK_L2 may include a second wafer alignment mark region WF_AL_2a including the first lower wafer alignment mark ALK_La2, and a third wafer alignment mark region WF_AL_3a including the second wafer alignment mark ALK_Lb2.

A central axis Cz1a of each of the alignment patterns of the first lower wafer alignment mark ALK_La2 and a central axis Cz1b of each of the alignment patterns of the second lower wafer alignment mark ALK_Lb2 may not be aligned. However, embodiments are not limited thereto. For example, a central axis Cz1a of each of the alignment patterns of the first lower wafer alignment mark ALK_La2 and a central axis Cz1b of each of the alignment patterns of the second lower wafer alignment mark ALK_Lb2 may be aligned in the +Y direction, but be spaced apart from each other in the +Y direction. The alignment patterns of the first lower wafer alignment mark ALK_La2 and the alignment patterns of the second lower wafer alignment mark ALK_Lb2 may have a linear shape or a bar shape extending in the +Y direction, respectively.

Figure 12C:
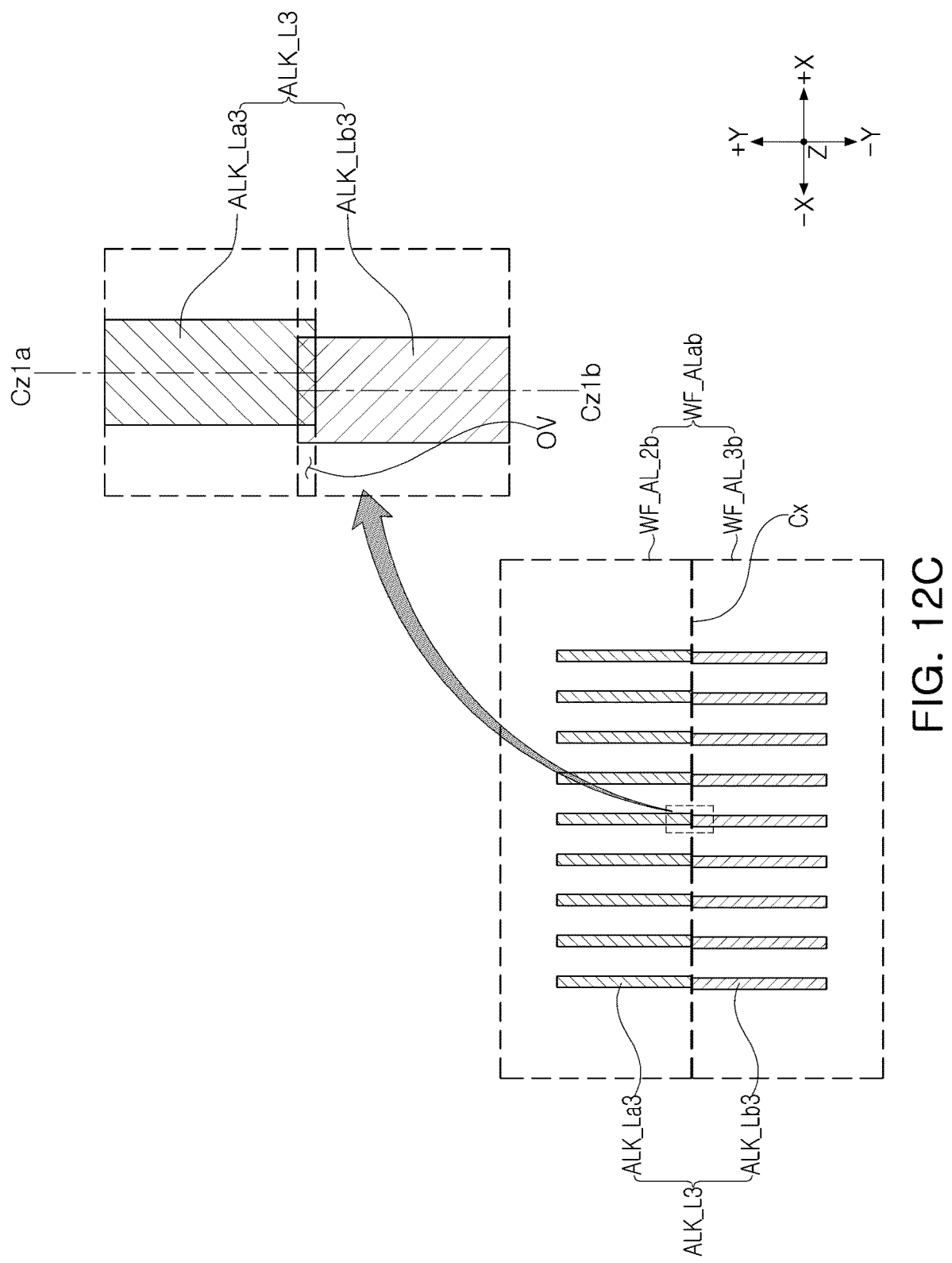

In a modified example, referring to FIG. 12C, a lower wafer alignment mark ALK_L3 in the modified example may include alignment patterns of a first lower wafer alignment mark ALK_La3 and alignment patterns of a second lower wafer alignment mark ALK_Lb3, including a region OV partially overlapping each other in the +Y direction. Therefore, a lower central wafer alignment mark region WF_ALab including the lower wafer alignment mark ALK_L3 may include a second wafer alignment mark region WF_AL_2b including the first lower wafer alignment mark ALK_La3, and a third wafer alignment mark region WF_AL_3b including the second lower wafer alignment mark ALK_Lb3.

A central axis Cz1a of each of the alignment patterns of the first lower wafer alignment mark ALK_La3 and a central axis Cz1b of each of the alignment patterns of the second lower wafer alignment mark ALK_Lb3 may not be aligned. However, embodiments are not limited thereto. For example, a central axis Cz1a of each of the alignment patterns of the first lower wafer alignment mark ALK_La3 and a central axis Cz1b of each of the alignment patterns of the second lower wafer alignment mark ALK_Lb3 may be aligned in the +Y direction, but include the region OV partially overlapping each other in the +Y direction. The alignment patterns of the first lower wafer alignment mark ALK_La3 and alignment patterns of the second lower wafer alignment mark ALK_Lb3 may have a linear shape or a bar shape extending in the +Y direction, respectively.

Figure 12D:
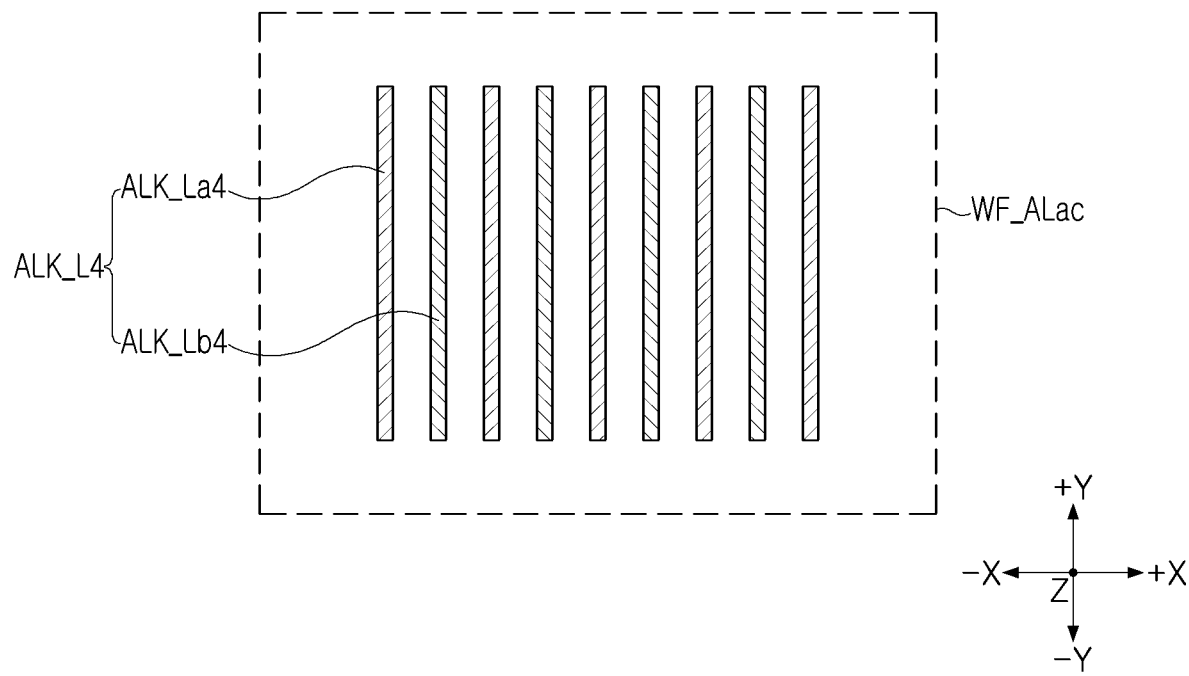

In a modified example, referring to FIG. 12D, a lower wafer alignment marks ALK_L4 in the modified example may include patterns of a first lower wafer alignment mark ALK_La4 and patterns of a second lower wafer alignment mark ALK_Lb4, alternately and repeatedly arranged in the +X direction. Therefore, a lower central wafer alignment mark region WF_ALac including the lower wafer alignment mark ALK_L4 may be provided. In this case, the second wafer alignment mark region WF_AL_2 and the third wafer alignment mark region WF_AL_3, illustrated in FIG. 11, may overlap each other to form the lower central wafer alignment mark region WF_ALac.

The patterns of the first lower wafer alignment mark ALK_La4 and the patterns of the second lower wafer alignment mark ALK_Lb4 may have a linear shape or a bar shape extending in the +Y direction, respectively.

Figure 12E:
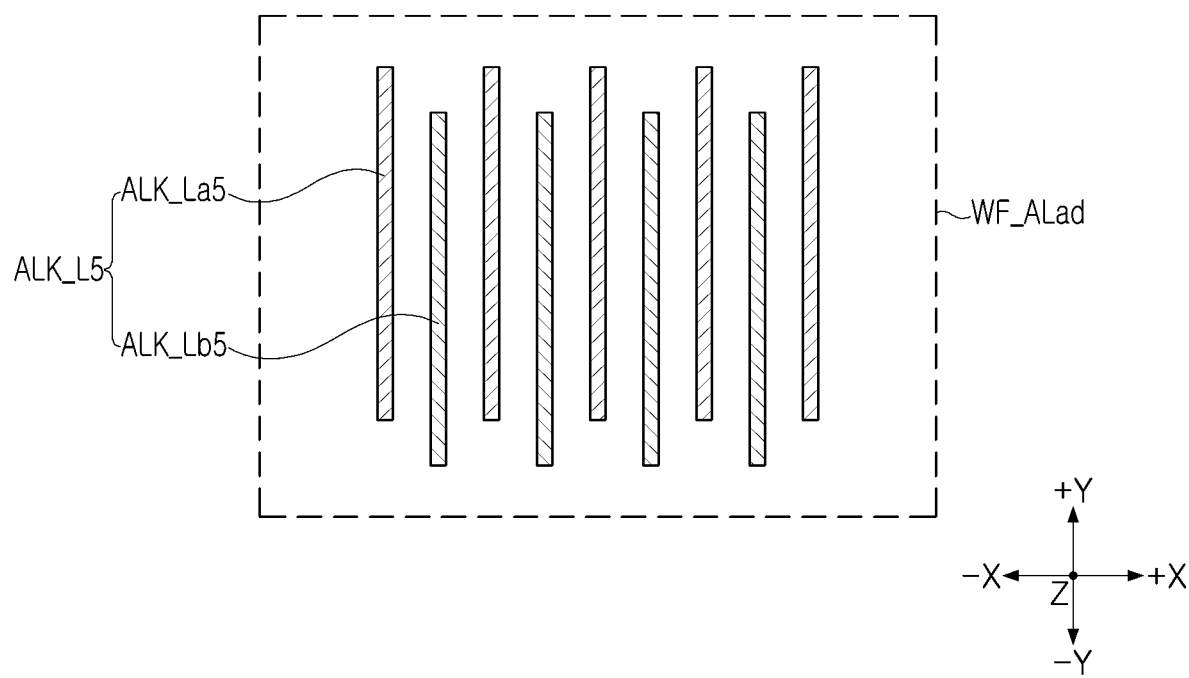

In a modified example, referring to FIG. 12E, a lower wafer alignment mark ALK_L5 in the modified example may include patterns of a first lower wafer alignment mark ALK_La5 and patterns of a second lower wafer alignment mark ALK_Lb5, alternately arranged in the +X direction but having end portions not aligned in the +X direction. Therefore, a lower central wafer alignment mark region WF_ALad including the lower wafer alignment mark ALK_L5 may be provided. In this case, the second wafer alignment mark region WF_AL_2 and the third wafer alignment mark region WF_AL_3, illustrated in FIG. 11, may overlap each other to form the lower central wafer alignment mark region WF_ALad.

The patterns of the first lower wafer alignment mark ALK_La5 and the patterns of the second lower wafer alignment mark ALK_Lb5 may have a linear shape or a bar shape extending in the +Y direction, respectively.

Figure 12F:
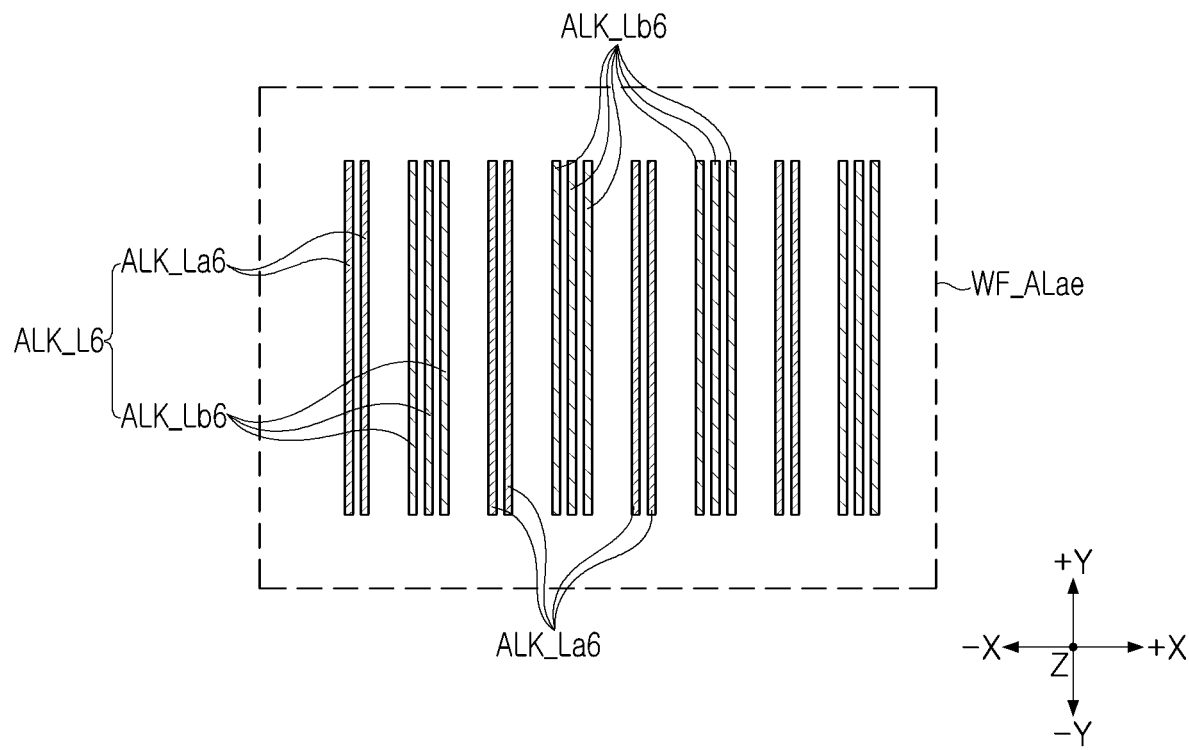

In a modified example, referring to FIG. 12F, a lower wafer alignment mark ALK_L6 in the modified example may include a first lower wafer alignment mark ALK_La6 and a second lower wafer alignment mark ALK_Lb6, alternately and repeatedly arranged in the +X direction but having different numbers of patterns. For example, "x" patterns of the first lower wafer alignment mark ALK_La6 and "y" patterns of the second lower wafer alignment mark ALK_Lb6 may be alternately and repeatedly arranged in the +X direction. In this case, "x" and "y" may be different positive integers. For example, "x" may be 2, and "y" may be 3. Alternatively, "x" may be 1, and "y" may be 2 or 3. The patterns of the first lower wafer alignment mark ALK_La6 and the patterns of the second lower wafer alignment mark ALK_Lb6 may have a linear shape or a bar shape extending in the +Y direction, respectively.

Therefore, a lower central wafer alignment mark region WF_ALae including the lower wafer alignment mark ALK_L6 may be provided. In this case, the second wafer alignment mark region WF_AL_2 and the third wafer alignment mark region WF_AL_3, illustrated in FIG. 11, may overlap each other to form the lower central wafer alignment mark region WF_ALae.

In other embodiments, the second wafer alignment mark region WF_AL_2 and the third wafer alignment mark region WF_AL_3 may include patterns having different sizes and/or different widths.

Next, as previously illustrated with reference to FIGS. 10A and 10B, the upper central wafer alignment mark region WF_ALb may be disposed in a central region within the first shot region SA1 of the semiconductor wafer WFb. Hereinafter, an example of the upper central wafer alignment mark region WF_ALb will be illustrated with reference to FIG. 13.

Figure 13:
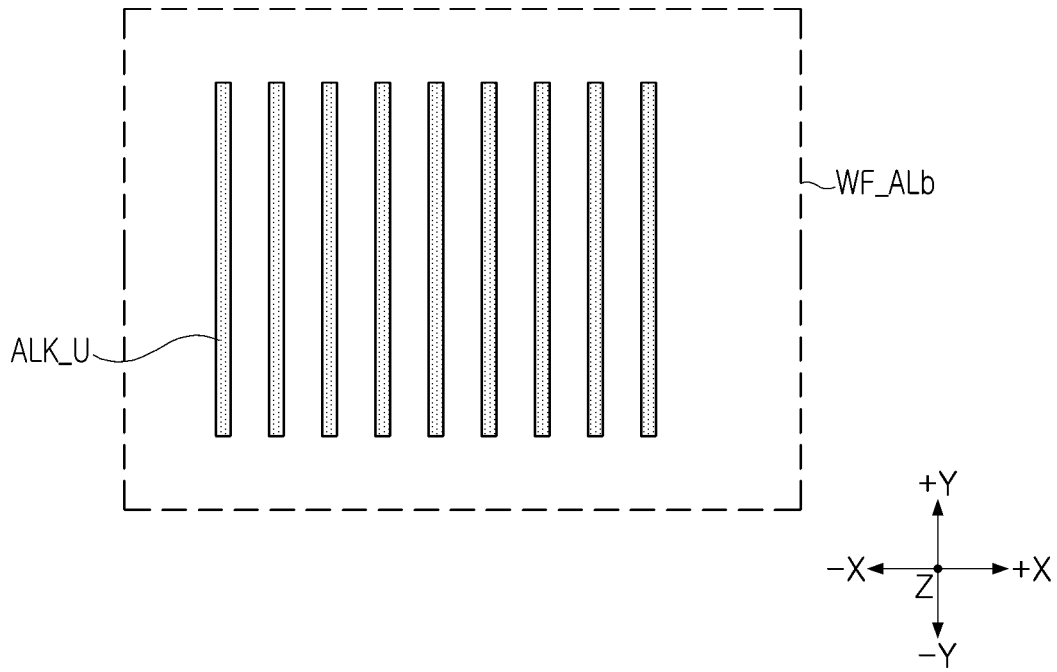
FIG. 13 is a top view schematically illustrating a wafer alignment mark formed using the second photolithography process of FIGS. 10A and 10B, according to an embodiment.

Referring to FIG. 13, the upper central wafer alignment mark region WF_ALb of the semiconductor wafer WFb, as illustrated in FIGS. 10A and 10B, may include an upper wafer alignment mark ALK_U. The upper wafer alignment mark ALK_U may be alignment patterns having a linear shape or a bar shape extending in the +Y direction, respectively.

Next, an example of a central wafer alignment mark region WF_AL of a semiconductor wafer WFc according to an embodiment will be illustrated with reference to FIGS. 14A and 14B.

Figure 14A:
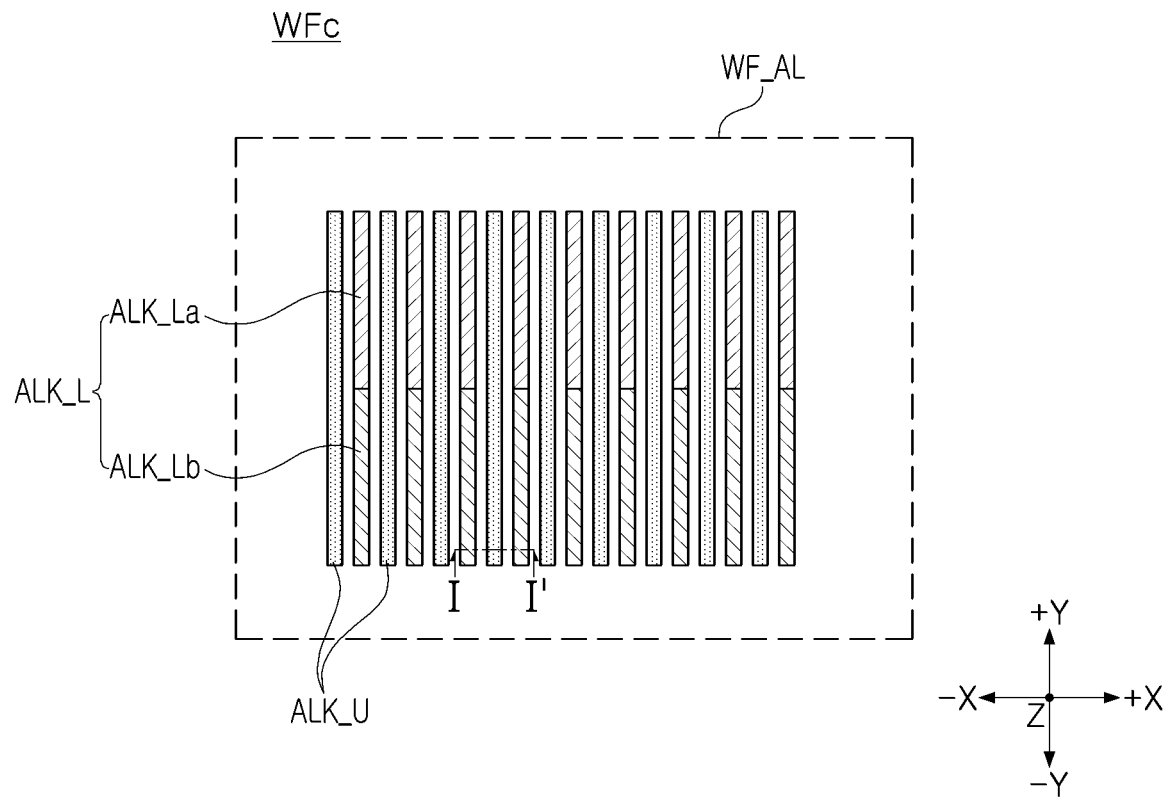
FIG. 14A is a top view schematically illustrating a wafer alignment mark formed using a first photolithography process and a wafer alignment mark formed using a second photolithography process, for manufacturing a semiconductor device according to an embodiment.
Figure 14B:
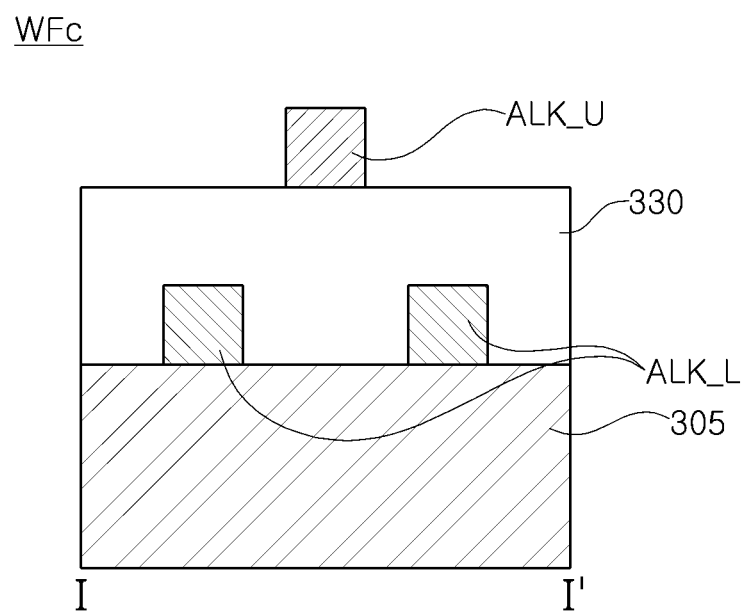
FIG. 14B is a cross-sectional view schematically illustrating the portion of FIG. 14A, taken along line I-I'.

FIG. 14A may be a plan view illustrating an example of a central wafer alignment mark region WF_AL of a semiconductor wafer WFc according to an embodiment, and FIG. 14B is a cross-sectional view schematically illustrating the portion taken along line I-I' of FIG. 14A.

Referring to FIGS. 14A and 14B, a central wafer alignment mark region WF_AL of a semiconductor wafer WFc according to an embodiment may include a lower wafer alignment mark ALK_L and an upper wafer alignment mark ALK_U.

As illustrated with reference to FIG. 11, the lower wafer alignment mark ALK_L may be formed in the lower central wafer alignment mark region (WF_ALa of FIG. 11). As illustrated in FIG. 11, the lower wafer alignment mark ALK_L may include the first lower wafer alignment mark ALK_La and the second lower wafer alignment mark ALK_Lb, arranged with the first horizontal axis Cx interposed therebetween.

In some embodiments, the lower wafer alignment mark ALK_L may be replaced with any one of the lower wafer alignment marks ALK_L1 to ALK_L6, illustrated with reference to FIGS. 12A to 12F.

The upper wafer alignment mark ALK_U may be formed in the upper central wafer alignment mark region (WF_ALb of FIG. 13), as illustrated with reference to FIG. 13.

The lower central wafer alignment mark region (WF_ALa in FIG. 11) and the upper central wafer alignment mark region (WF_ALb in FIG. 13) may overlap each other, and may be defined as a central wafer alignment mark region WF_AL.

In some embodiments, the lower wafer alignment mark ALK_L may be formed on a semiconductor substrate 305 of the semiconductor wafer WFc.

In some embodiments, the upper wafer alignment mark ALK_U may be formed on an insulating layer 330 covering the lower wafer alignment mark ALK_L on the semiconductor substrate 305.

Lower alignment patterns of the lower wafer alignment mark ALK_L and upper alignment patterns of the upper wafer alignment mark ALK_U may be alternately arranged in a +X direction. Alignment information may be obtained using the lower alignment patterns of the lower wafer alignment mark ALK_L and the upper alignment patterns of the upper wafer alignment mark ALK_U.

The lower wafer alignment mark ALK_L and the upper wafer alignment mark ALK_U may provide various pieces of alignment information. For example, the lower wafer alignment mark ALK_L and the upper wafer alignment mark ALK_U may be used as alignment marks for aligning wafers in an exposure process, respectively. Alternatively, the lower wafer alignment mark ALK_L and the upper wafer alignment mark ALK_U may be used as overlay alignment marks in an exposure process, respectively.

Figure 15:
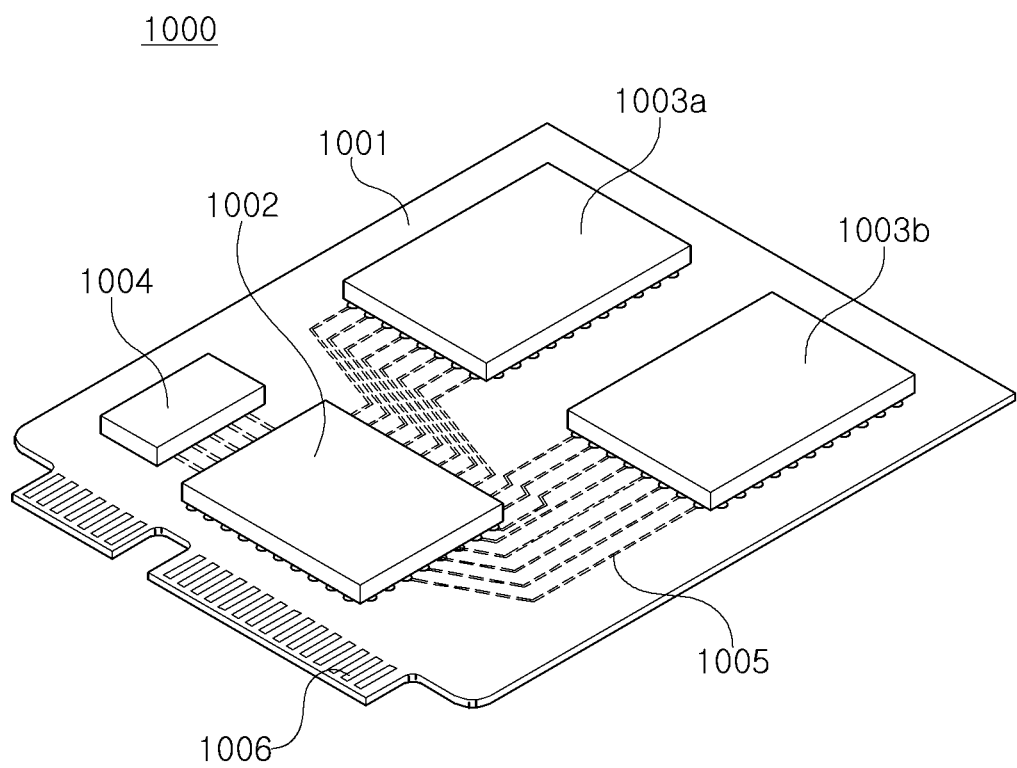
FIG. 15 is a perspective view schematically illustrating a system including a semiconductor package formed by a method of manufacturing a semiconductor device according to an embodiment.

FIG. 15 is a perspective view schematically illustrating a system including a semiconductor package formed by a method of manufacturing a semiconductor device according to an embodiment.

Referring to FIG. 15, an electronic system 1000 may include a main substrate 1001, a controller 1002 mounted on the main substrate 1001, one or more first semiconductor packages 1003a and 1003b, and a second semiconductor package 1004.

In some embodiments, the one or more first semiconductor packages 1003a and 1003b may include a non-volatile memory device. For example, the one or more first semiconductor packages 1003a and 1003b may include a NAND flash memory device.

In some embodiments, the second semiconductor package 1004 may include a volatile memory device. For example, the second semiconductor package 1004 may include a DRAM device.

The one or more first semiconductor packages 1003a and 1003b and the second semiconductor package 1004 may be connected to the controller 1002 by wiring patterns 1005 formed on the main substrate 1001.

The main substrate 1001 may include a connector 1006 including a plurality of pins, which may be coupled to an external host. The number and an arrangement of the plurality of pins in the connector 1006 may vary according to a communication interface between the electronic system 1000 and the external host. In example embodiments, the electronic system 1000 may communicate with the external host according to any one interface of a universal serial bus (USB), peripheral component interconnection express (PCIe), serial advanced technology attachment (SATA), M-Phy for universal flash storage (UFS), or the like.

In some embodiments, the electronic system 1000 may be operated by power supplied from the external host through the connector 1006. The electronic system 1000 may further include a power management integrated circuit (PMIC) distributing power, supplied from the external host, to the controller 1002 and the one or more first semiconductor packages 1003a and 1003b.

The controller 1002 may write data to the one or more first semiconductor packages 1003a and 1003b or read data from the one or more first semiconductor packages 1003a and 1003b, and may improve an operation speed of the electronic system 1000.

The second semiconductor package 1004 may be a buffer memory reducing a difference in speed between the one or more first semiconductor packages 1003a and 1003b, which may be a data storage space, and the external host. The second semiconductor package 1004 included in the electronic system 1000 may also operate as a type of cache memory, and may provide a space temporarily storing data in a control operation on the one or more first semiconductor packages 1003a and 1003b. When the second semiconductor package 1004 is included in the electronic system 1000, the controller 1002 may further include a DRAM controller controlling the second semiconductor package 1004 in addition to a NAND controller controlling the one or more first semiconductor packages 1003a and 1003b.

In some embodiments, the one or more first semiconductor packages 1003a and 1003b may be manufactured using the photomask, the photolithography process using the photomask, and the semiconductor process including the photolithography process according to various embodiments described above.

In some embodiments, the second semiconductor package 1004 may be manufactured using the photomask, the photolithography process using the photomask, and the semiconductor process including the photolithography process, described above.

In some embodiments, the controller 1002 may be manufactured using the photomask, the photolithography process using the photomask, and the semiconductor process including the photolithography process according to various embodiments described above.

According to various embodiments, a photomask, a method for forming the photomask, a photolithography process using the photomask, a semiconductor process using the photolithography process, a method of manufacturing a semiconductor device using the semiconductor process, a semiconductor device formed by the method, and a system including the semiconductor device may be provided.

According to various embodiments, a method of manufacturing a semiconductor device, using a semiconductor process configured to form one (1) center alignment mark by two (2) shot processes, and a semiconductor process configured to form one (1) center alignment mark by one (1) shot process, may be provided.

According to various embodiments, a method of manufacturing a semiconductor device, using a first semiconductor process configured to form one (1) center alignment mark by two (2) shot processes and a second semiconductor process configured to form one (1) center alignment mark by one (1) shot process, may be provided.

Various advantages and effects of the present inventive concept are not limited to the above description, and can be more easily understood in the process of describing specific embodiments.

While example embodiments have been illustrated and described above, it will be apparent to those skilled in the art that modifications and variations could be made without departing from the scope as defined by the appended claims.

What is claimed is:

1. A method comprising:
forming a first photomask including a first mask layout region, wherein the first mask layout region includes N mask chip regions and a first mask scribe lane region surrounding each of the N mask chip regions;
forming a second photomask including a second mask layout region, wherein the second mask layout region includes M mask chip regions and a second mask scribe lane region surrounding each of the M mask chip regions;
performing a first semiconductor process including a first photolithography process using the first mask layout region of the first photomask on a semiconductor wafer; and
performing a second semiconductor process including a second photolithography process using the second mask layout region of the second photomask on the semiconductor wafer,
wherein the first photolithography process is an extreme ultraviolet (EUV) photolithography process,
the first photomask is an EUV photomask,
N is a natural number of 2 or more,
M=2*N,
wherein each of the N mask chip regions of the first photomask comprises first circuit layout patterns,
wherein each of the M mask chip regions of the second photomask comprise second circuit layout patterns,
wherein the first mask scribe lane region of the first photomask comprises first mask alignment patterns,
wherein the second mask scribe lane region of the second photomask comprises second mask alignment patterns,
wherein the semiconductor wafer comprises a semiconductor substrate, lower alignment patterns and lower circuit patterns on the semiconductor substrate, and upper alignment patterns and upper circuit patterns on the semiconductor substrate,
wherein the lower alignment patterns and the lower circuit patterns are formed by performing the first semiconductor process including the first photolithography process using the first mask layout region of the first photomask, and
wherein the upper alignment patterns and the upper circuit patterns are formed by performing the second semiconductor process including the second photolithography process using the second mask layout region of the second photomask.

2. The method of claim 1, wherein the semiconductor wafer comprises a plurality of shot regions, and each of the plurality of shot regions comprises M wafer chip regions corresponding to the M mask chip regions, and a wafer scribe lane region surrounding each of the M wafer chip regions.

3. The method of claim 2, wherein the first photolithography process using the first photomask comprises sequentially performing a first shot process a plurality of times, and
wherein the first shot process comprises aligning the semiconductor wafer, irradiating light from an EUV light source onto a surface of the semiconductor wafer, and performing the first shot process twice in each of the plurality of shot regions of the semiconductor wafer.

4. The method of claim 3, wherein the performing the first shot process twice in each of the plurality of shot regions of the semiconductor wafer comprises:
performing the first shot process twice in an upper area of a first shot region among the plurality of shot regions of the semiconductor wafer, and
performing the first shot process twice, in a lower area of the first shot region.

5. The method of claim 4, wherein the first shot process is performed sequentially in one or more shot regions, adjacent to the first shot region, after performing the first shot process twice in the upper area of the first shot region and before performing the first shot process twice in the lower area of the first shot region.

6. The method of claim 4, wherein each shot region of the plurality of shot regions of the semiconductor wafer comprises a wafer alignment mark region,
wherein the wafer alignment mark region is disposed within the wafer scribe lane region.

7. The method of claim 6, wherein the wafer alignment mark region comprises alignment patterns of a first lower wafer alignment mark formed by the first shot process performed on the upper area, and alignment patterns of a second lower wafer alignment mark formed by the first shot process performed on the lower area, and
wherein the lower alignment patterns comprise the alignment patterns of the first lower wafer alignment mark and the alignment patterns of the second lower wafer alignment mark.

8. The method of claim 7, wherein the alignment patterns of the first lower wafer alignment mark and the alignment patterns of the second lower wafer alignment mark have a linear shape or a bar shape extending in a first direction, respectively.

9. The method of claim 8, wherein the alignment patterns of the first lower wafer alignment mark are adjacent to the alignment patterns of the second lower wafer alignment mark in the first direction.

10. The method of claim 8, wherein the alignment patterns of the first lower wafer alignment mark and the alignment patterns of the second lower wafer alignment mark are alternately and repeatedly arranged in a second direction,
wherein the second direction intersects the first direction.

11. The method of claim 7, wherein the second photolithography process using the second photomask comprises sequentially performing a second shot process a plurality of times,
wherein the second shot process comprises aligning the semiconductor wafer, irradiating light from the EUV light source or a light source having a wavelength longer than extreme ultraviolet light onto the surface of the semiconductor wafer, and performing the second shot process once in each of the plurality of shot regions of the semiconductor wafer.

12. The method of claim 11, wherein the wafer alignment mark region comprises alignment patterns of an upper wafer alignment mark formed by the second shot process,
the upper alignment patterns comprise alignment patterns of an upper wafer alignment mark,
the first lower wafer alignment mark is formed at a height level that is a same height level as a height level at which the second lower wafer alignment mark is formed, and
the upper wafer alignment mark is formed on a height level higher than the height level at which the first and second lower wafer alignment marks are formed.

13. The method of claim 1,
wherein the first photomask comprises first mask alignment patterns at center edges of the first mask scribe lane region above and below the N mask chip regions, and
the second photomask comprises a second mask alignment pattern in the second mask scribe lane region at a center of the second photomask.

14. The method of claim 1,
wherein the first photomask comprises:
a mask substrate having a first surface, and a second surface opposing the first surface;
a mask layout region on the first surface of the mask substrate; and
wherein the mask layout region comprises the N mask chip regions and the first mask scribe lane region,
wherein the first mask scribe lane region has a first side, and a second side opposing the first side,
wherein the first mask scribe lane region comprises first mask alignment patterns, and
wherein the first mask alignment patterns comprise:
a first mask alignment layout pattern adjacent to a central area on the first side; and
a second mask alignment layout pattern adjacent to a central area on the second side.

15. The method of claim 1,
wherein the lower circuit patterns are formed by performing the first semiconductor process including the first photolithography process using the first circuit layout patterns of the first photomask,
wherein the lower alignment patterns are formed by performing the first semiconductor process including the first photolithography process using the first mask alignment patterns of the first photomask,
wherein the upper circuit patterns are formed by performing the second semiconductor process including the second photolithography process using the second circuit layout patterns of the second photomask, and
wherein the upper alignment patterns are formed by performing the second semiconductor process including the second photolithography process using the second mask alignment patterns of the second photomask.

16. A method comprising:
loading a semiconductor wafer into a wafer stage of an extreme ultraviolet (EUV) photolithography equipment equipped with an extreme ultraviolet (EUV) photomask;
in the EUV photolithography equipment, sequentially performing a shot process a plurality of times, the shot process including aligning the semiconductor wafer and irradiating light from an extreme ultraviolet (EUV) light source to the semiconductor wafer; and
unloading the semiconductor wafer from the EUV photolithography equipment,
wherein the semiconductor wafer has a plurality of shot regions, each shot region of the plurality of shot regions has an upper shot region formed by one shot process of the shot process performed the plurality of times, and a lower shot region formed by another shot process of the shot process performed the plurality of times,
a central area of each shot region comprises a wafer alignment mark region, and the wafer alignment mark region comprises alignment patterns of a first wafer alignment mark formed by the one shot process and alignment patterns of a second wafer alignment mark formed by the another shot process.

17. The method of claim 16, wherein the alignment patterns of the first wafer alignment mark and the alignment patterns of the second wafer alignment mark have a linear shape or a bar shape extending in a first direction, respectively, and the alignment patterns of the first wafer alignment mark are repeatedly arranged while being spaced apart from each other in a second direction that intersects the first direction.

18. The method of claim 17, wherein the alignment patterns of the first wafer alignment mark are adjacent to the alignment patterns of the second wafer alignment mark in the first direction.

19. The method of claim 17, wherein the alignment patterns of the first wafer alignment mark and the alignment patterns of the second wafer alignment mark are alternately and repeatedly arranged in the second direction.

* * * * *